US011335587B2

(12) United States Patent
Ota et al.

(10) Patent No.: US 11,335,587 B2
(45) Date of Patent: *May 17, 2022

(54) SUBSTRATE PROCESSING APPARATUS AND SUBSTRATE PROCESSING METHOD

(71) Applicant: SCREEN Holdings Co., Ltd., Kyoto (JP)

(72) Inventors: Takashi Ota, Kyoto (JP); Manabu Okutani, Kyoto (JP); Hiroshi Abe, Kyoto (JP)

(73) Assignee: SCREEN Holdings Co., Ltd.

( * ) Notice: Subject to any disclaimer, the term of this patent is extended or adjusted under 35 U.S.C. 154(b) by 31 days.

This patent is subject to a terminal disclaimer.

(21) Appl. No.: 16/889,834

(22) Filed: Jun. 2, 2020

(65) Prior Publication Data

US 2020/0294843 A1    Sep. 17, 2020

Related U.S. Application Data

(63) Continuation of application No. 15/460,875, filed on Mar. 16, 2017, now Pat. No. 10,734,271.

(30) Foreign Application Priority Data

Mar. 29, 2016  (JP) ................................ 2016-066311

(51) Int. Cl.
*H01L 21/687* (2006.01)
*H01L 21/67* (2006.01)
*B08B 3/08* (2006.01)

(52) U.S. Cl.
CPC .. *H01L 21/68742* (2013.01); *H01L 21/67028* (2013.01); *H01L 21/67109* (2013.01); *H01L 21/68728* (2013.01); *B08B 3/08* (2013.01); *H01L 21/67103* (2013.01); *H01L 21/687* (2013.01); *H01L 21/68721* (2013.01)

(58) Field of Classification Search
None
See application file for complete search history.

(56) References Cited

U.S. PATENT DOCUMENTS

| | | | |
|---|---|---|---|
| 8,043,469 B2 | 10/2011 | Nakamori et al. | 156/345.21 |
| 8,828,183 B2 | 9/2014 | Namba et al. | 156/345.21 |
| 10,734,271 B2 * | 8/2020 | Ota | H01L 21/68728 |
| 2007/0128373 A1 | 6/2007 | Hara et al. | 427/443.1 |

(Continued)

FOREIGN PATENT DOCUMENTS

| | | |
|---|---|---|
| CN | 101097409 B | 12/2010 |
| CN | 104205304 A | 12/2014 |

(Continued)

*Primary Examiner* — Sylvia MacArthur
(74) *Attorney, Agent, or Firm* — Ostrolenk Faber LLP

(57) ABSTRACT

A substrate processing apparatus includes a substrate holding unit which holds and rotates a substrate in a horizontal orientation, a substrate heating unit which has a heating surface which faces the substrate, held by the substrate holding unit, from below and overlaps with an outermost periphery of the substrate in top view, and heats the substrate in a state of contacting a lower surface of the substrate, a transferring unit which transfers the substrate between the substrate holding unit and the substrate heating unit, and a processing fluid supplying unit which supplies a processing fluid toward the substrate held by the substrate holding unit.

5 Claims, 23 Drawing Sheets

(56) References Cited

U.S. PATENT DOCUMENTS

| | | | |
|---|---|---|---|
| 2009/0093123 A1 | 4/2009 | Lee et al. | 438/706 |
| 2011/0126985 A1 | 6/2011 | Ohizumi et al. | 156/345.55 |
| 2012/0329000 A1 | 12/2012 | Hirakawa | 432/5 |
| 2014/0065309 A1 | 3/2014 | Kashiyama et al. | |
| 2014/0090669 A1 | 4/2014 | Hinode et al. | 134/19 |
| 2014/0127908 A1 | 5/2014 | Okutani | 438/694 |
| 2015/0090694 A1 | 4/2015 | Hashimoto et al. | 216/83 |
| 2015/0243542 A1 | 8/2015 | Yoshihara et al. | 156/345.15 |
| 2015/0258553 A1 | 9/2015 | Kobayashi et al. | |
| 2015/0279708 A1* | 10/2015 | Kobayashi | C23C 16/458 438/747 |
| 2017/0287769 A1 | 10/2017 | Ota et al. | |
| 2020/0294843 A1* | 9/2020 | Ota | H01L 21/67028 |

FOREIGN PATENT DOCUMENTS

| | | |
|---|---|---|
| JP | 2007-177324 A | 7/2007 |
| JP | 2009-094514 A | 4/2009 |
| JP | 2011-119408 A | 6/2011 |
| JP | 2011-199139 A | 10/2011 |
| JP | 2014-072389 A | 4/2014 |
| JP | 2014-093449 | 5/2014 |
| JP | 2015-162597 A | 9/2015 |
| KR | 10-2015-0090943 A | 8/2015 |
| TW | 201413852 A | 4/2014 |
| TW | 201539627 A | 10/2015 |

* cited by examiner

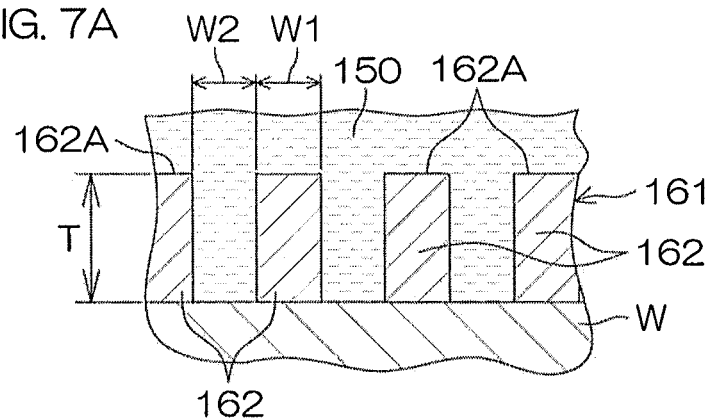
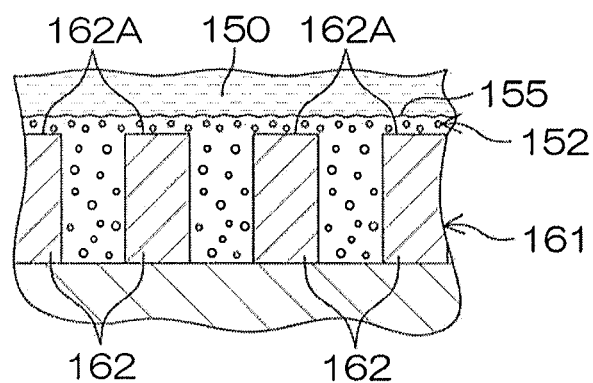
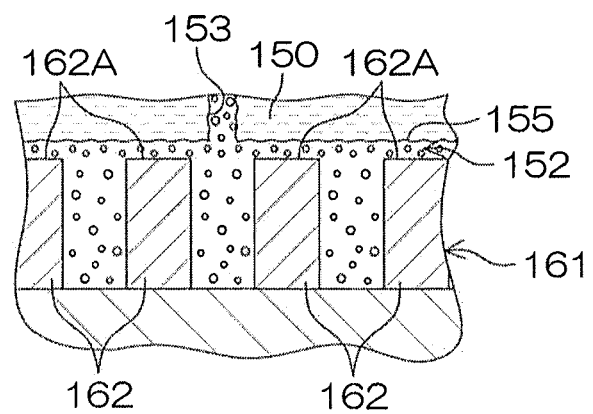

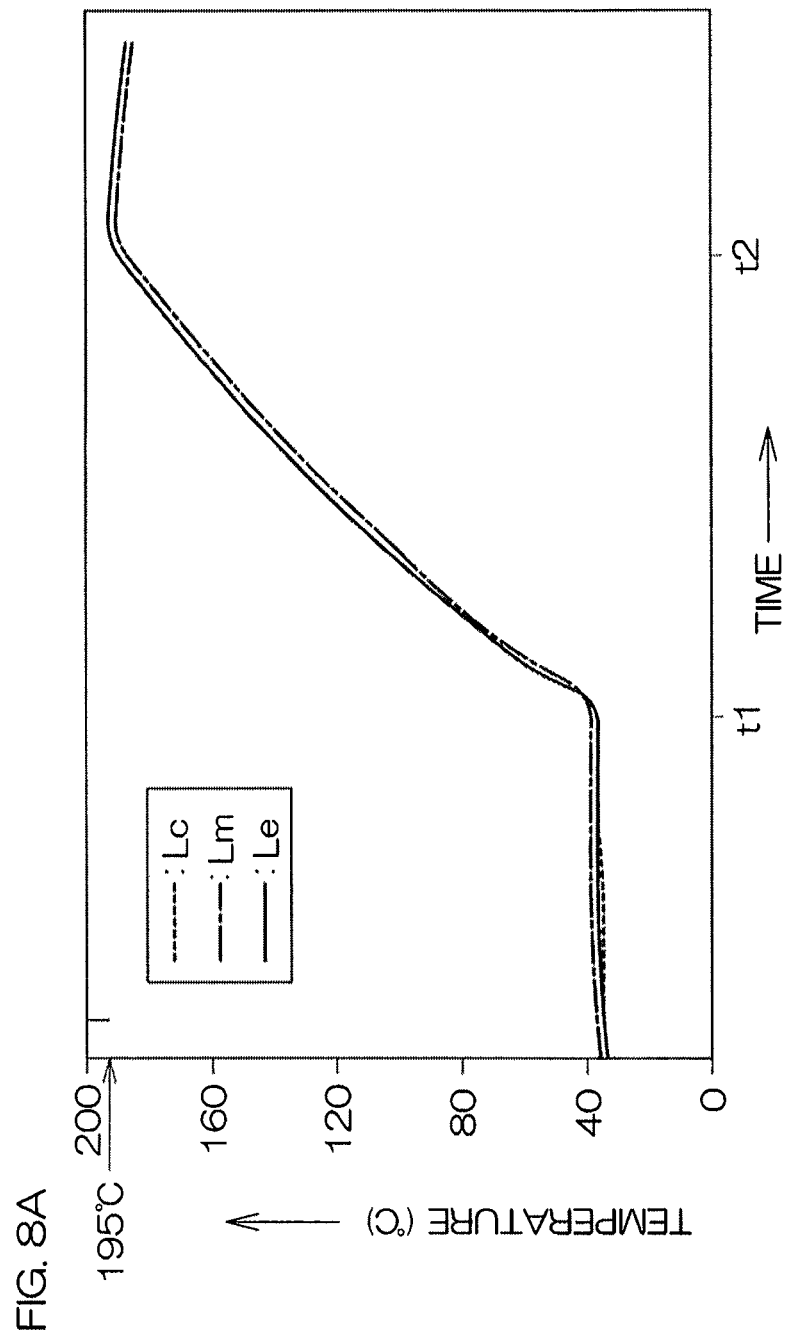

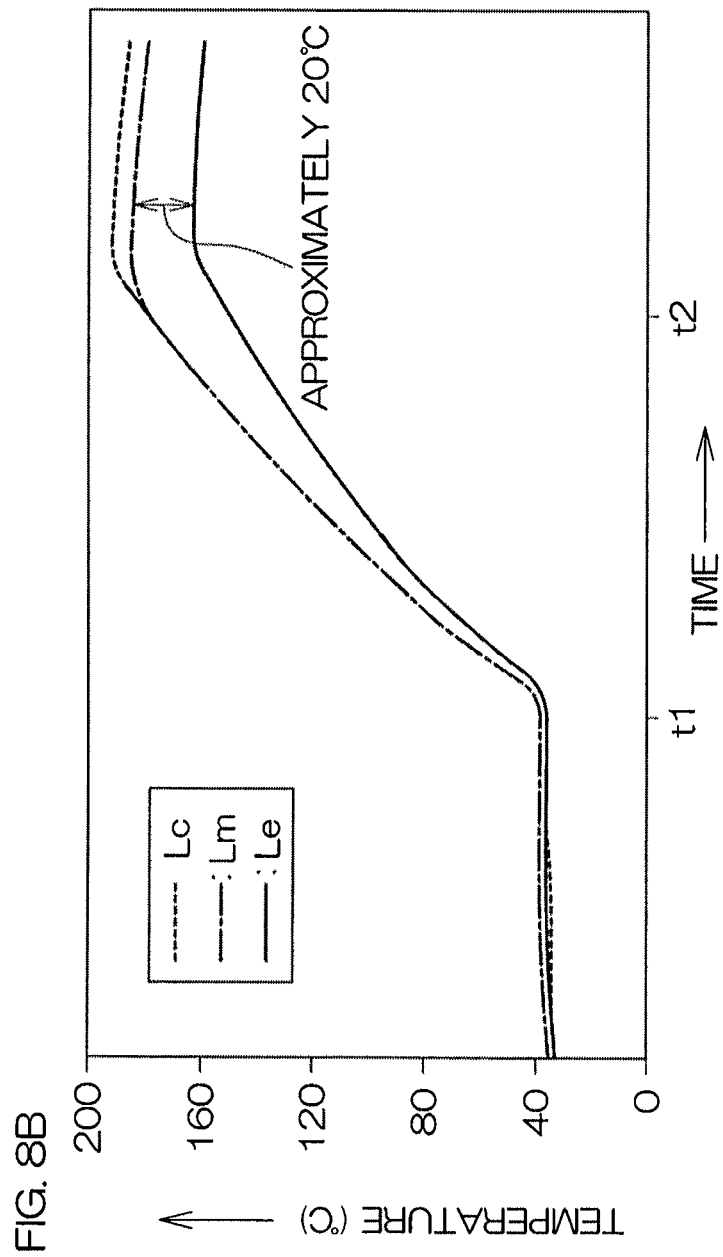

SUBSTRATE PROCESSING APPARATUS AND SUBSTRATE PROCESSING METHOD

BACKGROUND OF THE INVENTION

CROSS-REFERENCE TO RELATED APPLICATIONS

The present application is a continuation of U.S. patent application Ser. No. 15/460,875, filed Mar. 16, 2017, which claims priority to Japanese Patent Application No. 2016-066311, filed Mar. 29, 2016, the contents of all of which are incorporated herein by reference.

Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

Description of the Related Art

U.S. Patent Application Publication No. 2014/127908 discloses a substrate processing apparatus that dries a substrate after processing the substrate by a processing liquid. The substrate processing apparatus includes a substrate holding/rotating mechanism that rotates the substrate while holding it horizontally and a heater arranged to face a lower surface of the substrate held by the substrate holding/rotating mechanism. The substrate holding/rotating mechanism includes a rotating ring and a plurality of lower contacting pins erected on the rotating ring and supporting a peripheral edge portion of the substrate. The substrate is placed and held on the lower contacting pins and the substrate is rotated by the rotating ring rotating in this state. When the substrate is to be dried, the heater is elevated toward the lower surface of the substrate and a heating surface of the heater is brought close to a heating surface of the substrate.

SUMMARY OF THE INVENTION

With the substrate processing apparatus of the Publication, the heater is arranged at an inner side of the rotating ring in top view. The heating surface of the heater is thus smaller than the substrate and therefore an outer peripheral region of the substrate is more difficult to heat in comparison to a region further inward thereof. Uneven heating of the substrate thus occurs and therefore in-plane non-uniformity tends to occur readily in substrate processing.

An object of the present invention is thus to provide a substrate processing apparatus and a substrate processing method by which in-plane uniformity of substrate processing can be improved.

The present invention provides a substrate processing apparatus including a substrate holding unit which holds a substrate in a horizontal orientation by clamping a peripheral edge portion of the substrate, a substrate rotating unit which rotates the substrate held by the substrate holding unit, a substrate heating unit which has a heating surface which faces the substrate, held by the substrate holding unit, from below and overlaps with an outermost periphery of the substrate in top view, and heats the substrate in a state of contacting a lower surface of the substrate, a transferring unit which transfers the substrate between the substrate holding unit and the substrate heating unit, and a processing fluid supplying unit which supplies a processing fluid toward the substrate held by the substrate holding unit.

With the present arrangement, an entirety of the substrate can be processed by the processing fluid by supplying the processing fluid toward the substrate while rotating the substrate in a state where the substrate is held by the substrate holding unit. On the other hand, the substrate faces the heating surface of the substrate heating unit and the outermost periphery of the substrate overlaps with the heating surface in top view, and therefore by transferring the substrate from the substrate holding unit to the substrate heating unit, the entirety of the substrate can be heated uniformly. Therefore both the processing by the processing fluid and the heating processing are performed uniformly on the entirety of the substrate, and in-plane uniformity of substrate processing can thus be improved. Moreover, the lower surface of the substrate contacts the heating surface of the substrate heating unit and therefore the substrate can be heated efficiently.

In a preferred embodiment of the present invention, the heating surface overlaps with the entirety of the substrate, held by the substrate holding unit, in top view. With the present arrangement, the entirety of the substrate can be heated more uniformly.

In the preferred embodiment of the present invention, the substrate holding unit is configured to be retractable outward from between the substrate and the heating surface. The substrate can thereby be heated in a state where the substrate holding unit is not interposed between the substrate and the heating surface. The in-plane uniformity of substrate processing (especially heating) can thus be improved further. Also, the substrate holding unit is retractable outward from between the substrate and the heating surface and therefore the substrate can be transferred from the substrate holding unit to the substrate heating unit to put the heating surface in contact with the substrate lower surface and the substrate can also be transferred from the substrate heating unit to the substrate holding unit without interfering with the substrate holding unit.

In the preferred embodiment of the present invention, the transferring unit includes an elevating/lowering member which supports the lower surface of the substrate at a position further inward than a position at which the substrate holding unit contacts the substrate and moves vertically and penetratingly through the heating surface, and an elevating/lowering unit which moves the elevating/lowering member vertically. With the present arrangement, the substrate can be transferred between the substrate holding unit and the substrate heating unit by making the elevating/lowering member move vertically by means of the elevating/lowering unit. The substrate can thus be transferred between the substrate holding unit and the substrate heating unit without inverting a vertical relationship thereof. Design of a configuration where the substrate heating unit has a larger heating surface than the substrate is thereby made easy.

In the preferred embodiment of the present invention, the heating surface includes a movable portion, which moves vertically while supporting the lower surface of the substrate at a position further inward than a position at which the substrate holding unit contacts the substrate, and the transferring unit includes an elevating/lowering unit which moves the movable portion vertically. With the present arrangement, by providing the movable portion in an inner region of the heating surface, the substrate can be transferred between the substrate heating unit and the substrate holding unit by making the movable portion move vertically. The substrate can thus be transferred between the substrate holding unit and the substrate heating unit without inverting a vertical relationship of the substrate holding unit and a fixed portion (portion other than the movable portion) of the heating surface. Design of a configuration where the substrate heating unit has a larger heating surface than the substrate is thereby made easy.

In the preferred embodiment of the present invention, the substrate holding unit includes a holding member which contacts the peripheral edge portion of the substrate, the transferring unit includes an elevating/lowering unit which vertically moves the heating surface relative to the holding member, and the heating surface includes a recess which houses at least a portion of the holding member in a process in which the heating surface is elevated relative to the holding member by the elevating/lowering unit. With the present arrangement, the substrate can be received/passed between the heating surface of the substrate heating unit and the holding member of the substrate holding unit by vertically moving the heating surface to make a height of substrate support by the heating surface and a height of substrate holding by the substrate holding member be matched. On the other hand, the recess that houses at least a portion of the holding member is formed in the heating surface of the substrate heating unit and therefore the heating surface can be moved vertically relative to the holding member to transfer the substrate between the substrate heating unit and the substrate holding unit while avoiding interference of the holding member and the heating surface.

The recess may be a counterbored portion having a bottom surface. In this case, the holding member may be interposed between the substrate and the bottom surface (heating surface) of the counterbored portion inside the counterbored portion. Even in this case, the heating surface faces the substrate and the substrate can thus be heated by radiant heat.

In the preferred embodiment of the present invention, the substrate processing apparatus further includes a controller which controls at least the substrate rotating unit, the transferring unit, and the processing fluid supplying unit, and the controller is programmed to execute a fluid processing of supplying the processing fluid from the processing fluid supplying unit to the substrate while rotating the substrate, held by the substrate holding unit, by means of the substrate rotating unit, and a heating processing of transferring the substrate from the substrate holding unit to the substrate heating unit by the transferring unit after the fluid processing and heating the substrate by means of the substrate heating unit. With the present arrangement, during the fluid processing, the processing fluid is supplied to the substrate while the substrate is held and rotated and therefore the processing by the processing fluid can be applied uniformly to the entirety of the substrate. Also, during the heating processing, the substrate faces the heating surface of substrate heating unit and the outermost periphery of the substrate overlaps with the heating surface and therefore the entirety of the substrate can be heated uniformly. In-plane uniformity of substrate processing can thus be improved.

In the preferred embodiment of the present invention, the controller is programmed to further control the substrate holding unit, and the controller is programmed to move the substrate holding unit, in the heating processing, to a position of not being positioned between the lower surface of the substrate and the heating surface of the substrate heating unit. With the present arrangement, during the heating processing, the substrate holding unit is not interposed between the lower surface of the substrate and the heating surface and therefore the heating of the substrate is not obstructed by the substrate holding unit. The entirety of the substrate can thereby be heated more uniformly.

The holding member may have a clamping portion that contacts a peripheral end surface of the substrate and clamps the substrate. The clamping portion may be displaceable to a clamping state (closed state) of contacting the peripheral end surface of the substrate and clamping the substrate and a retracted state (open state) of being retracted from the peripheral end surface of the substrate. Also, the holding member may have a supporting portion that contacts a lower surface of the peripheral edge portion of the substrate and supports the substrate from lower side. The holding member may have the clamping portion and not have the supporting portion. In this case, the clamping portion may be retracted outward from between the substrate and the heating surface of the substrate heating unit. The holding member may have both the clamping portion and the supporting portion. In this case, the supporting portion may be at a position at which it is capable of supporting the lower surface of the peripheral edge portion of the substrate regardless of whether the clamping portion is in the clamping state (closed state) or the retracted state (open state). In such a case, it is preferable to provide the heating surface with a recess such as described above and arrange the supporting portion to be capable of being housed inside the recess.

The present invention also provides a substrate processing method including a substrate rotating step of rotating a substrate while holding it in a horizontal orientation by clamping a peripheral edge portion of the substrate by means of a substrate holding unit arranged inside a chamber, a processing fluid supplying step of supplying a processing fluid to a front surface of the substrate being rotated in the substrate rotating step, a transferring step of transferring from the substrate holding unit to a substrate heating unit inside the chamber after ending the substrate rotating step, and a substrate heating step of heating the substrate by bringing the lower surface of the substrate in contact with the heating surface, in a state where a lower surface of the substrate faces a heating surface of the substrate heating unit and an outermost periphery of the substrate overlaps with the heating surface in top view.

Ina preferred embodiment of the present invention, an entirety of the lower surface of the substrate faces the heating surface in the substrate heating step.

In the preferred embodiment of the present invention, the substrate holding unit is retracted outward from between the substrate and the heating surface in the substrate heating step.

The above and other elements, features, steps, and characteristics and advantages of the present invention will become more apparent from the following detailed description of preferred embodiments with reference to the attached drawings.

BRIEF DESCRIPTION OF THE DRAWINGS

FIG. 7A and FIG. 7B are illustrative sectional views for describing the forming of a gas phase layer at a front surface of a substrate, and FIG. 7C is a sectional view for describing splitting of a liquid film.

FIG. 8A is a diagram for describing an effect due to an entirety of a lower surface of a substrate facing a heating surface of a heater unit (example).

FIG. 8B is a diagram for describing an effect due to an entirety of a lower surface of a substrate facing a heating surface of a heater unit (comparative example).

DETAILED DESCRIPTION OF THE PREFERRED EMBODIMENTS

Figure 1:
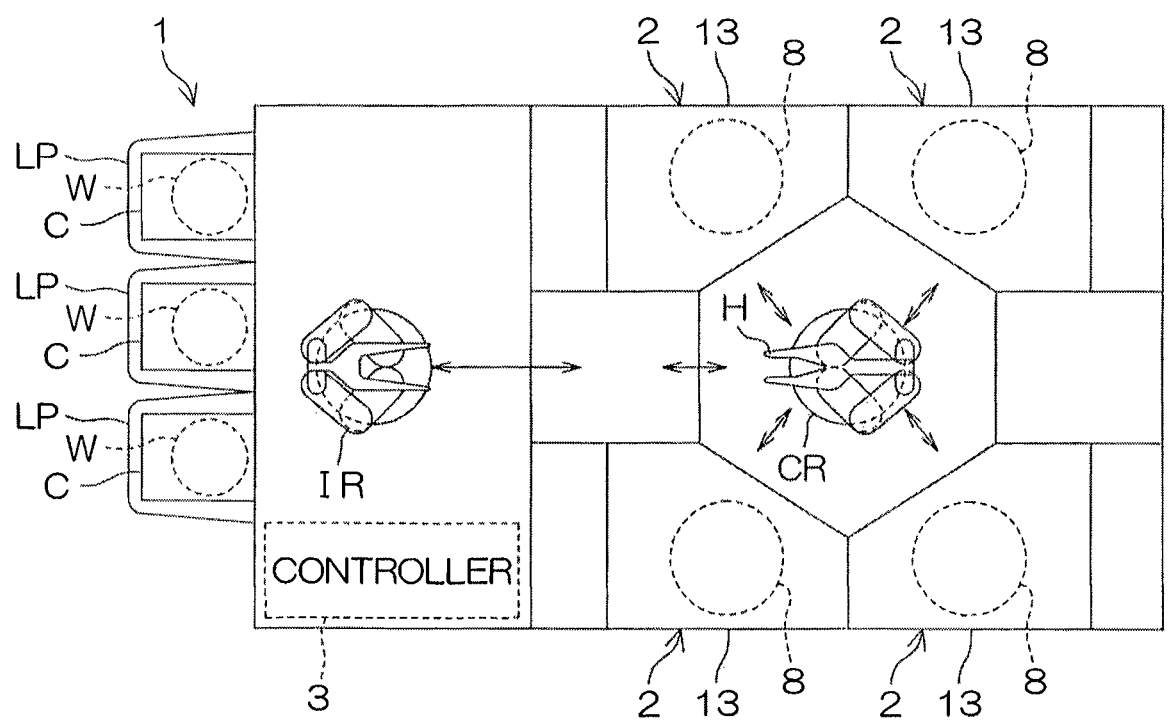
FIG. 1 is an illustrative plan view for describing a layout of an interior of a substrate processing apparatus according to a preferred embodiment of the present invention.

FIG. 1 is an illustrative plan view for describing a layout of an interior of a substrate processing apparatus according to a preferred embodiment of the present invention. The substrate processing apparatus 1 is a single substrate processing type apparatus that processes substrates W, such as silicon wafers, etc., one at a time. In the present preferred embodiment, the substrate W is a disk-shaped substrate. The substrate processing apparatus 1 includes a plurality of processing units 2 that process the substrates W by a processing liquid, load ports LP in which are placed carriers C that house the plurality of substrates W to be processed by the processing units 2, transfer robots IR and CR transferring the substrates W between the load ports LP and the processing units 2, and a controller 3 controlling the substrate processing apparatus 1. The transfer robot IR transfers the substrates W between the carriers C and the transfer robot CR. The transfer robot CR transfers the substrates W between the transfer robot IR and the processing units 2. The plurality of processing units 2 have, for example, the same arrangement.

Figure 2:
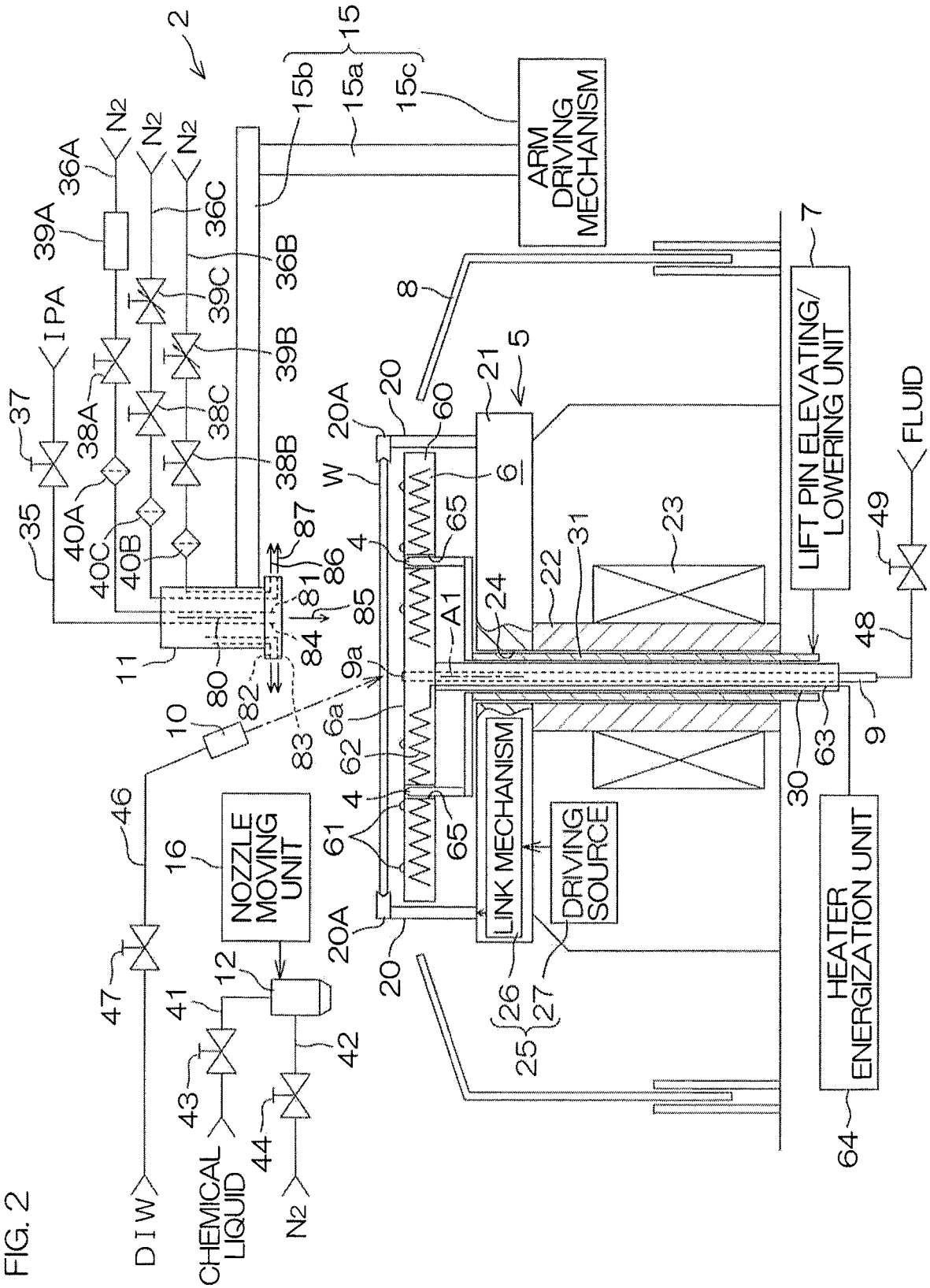
FIG. 2 is an illustrative sectional view for describing an arrangement example of a processing unit included in the substrate processing apparatus.

FIG. 2 is an illustrative sectional view for describing an arrangement example of a processing unit 2. The processing unit 2 includes a spin chuck 5 rotating a single substrate W around a vertical rotational axis A1 passing through a central portion of the substrate W while holding the substrate W in a horizontal orientation, a heater unit 6 heating the substrate W from a lower surface (lower side major surface) side, lift pins 4, as elevating/lowering members that elevate and lower to transfer the substrate W between the spin chuck 5 and the heater unit 6, a lift pin elevating/lowering unit 7 that moves the lift pins 4 vertically, a cylindrical cup 8 surrounding the spin chuck 5, a lower surface nozzle 9 supplying a processing fluid to a lower surface of the substrate W, a DIW nozzle 10 supplying deionized water (DIW) as a rinse liquid to an upper surface (upper side major surface) of the substrate W, a first moving nozzle 11 capable of moving above the substrate W, and a second moving nozzle 12 capable of moving above the substrate W. The processing unit 2 further includes a chamber 13 (see FIG. 1) that houses the cup 8, etc. Although unillustrated, the chamber 13 has formed therein a carry-in/carry-out port for carrying in and carrying out of the substrate W and includes a shutter unit that opens and closes the carry-in/carry-out port.

The spin chuck 5 is a substrate holding unit that holds the substrate W and is a substrate rotating unit that rotates the substrate W. Specifically, the spin chuck 5 includes chuck pins 20 (chuck members, substrate holding unit) as holding members that hold the substrate, a spin base 21, a rotating shaft 22 coupled to a lower surface center of the spin base 21, and an electric motor 23 (substrate rotating unit) applying a rotating force to the rotating shaft 22. The rotating shaft 22 extends in a vertical direction along the rotational axis A1 and is a hollow shaft in the present preferred embodiment. The spin base 21 is coupled to an upper end of the rotating shaft 22. The spin base 21 has a disk shape oriented along a horizontal direction. The plurality of chuck pins 20 are disposed at intervals in a circumferential direction at a peripheral edge portion of an upper surface of the spin base 21. The plurality of chuck pins 20 constitute an example of a holding member that contacts a peripheral edge portion of the substrate W and are capable of being opened and closed between a closed state of contacting a peripheral end of the substrate W and gripping the substrate W and an open state of being retracted from the peripheral end of the substrate W. The substrate holding unit may also be referred to as a substrate holder.

A chuck pin driving unit 25 is included to drive the chuck pins 20 to open and close. The chuck pin driving unit 25 includes, for example, a link mechanism 26, incorporated in the spin base 21, and a driving source 27, disposed outside the spin base 21. The driving source 27 includes, for example, a ball screw mechanism and an electric motor that applies a driving force thereto. A specific arrangement example of the chuck pin driving unit 25 is described in Japanese Patent Application Publication No. 2008-034553, etc.

The heater unit 6 is disposed above the spin base 21. A supporting shaft 30, extending in the vertical direction along the rotational axis A1, is coupled to a lower surface of the heater unit 6. The supporting shaft 30 is inserted through a penetrating hole 24 which is formed in a central portion of the spin base 21, and the hollow rotating shaft 22. A lower end of the supporting shaft 30 extends further lower than a lower end of the rotating shaft 22.

On the other hand, a hollow elevating/lowering shaft 31 is disposed inside the rotating shaft 31 so as to house the supporting shaft 30. The elevating/lowering shaft 31 extends in the vertical direction along the rotational axis A1 and is inserted through the penetrating hole 24 of the spin base 21 and the rotating shaft 22. The lift pins 4 are coupled to an upper end of the elevating/lowering shaft 31. A lower end of the elevating/lowering shaft 31 extends further lower than the lower end of the rotating shaft 22. The lift pin elevating/lowering unit 7 is coupled to the lower end of the elevating/lowering shaft 31. The lift pins 4 are disposed so as to penetrate through the heater unit 6. By actuation of the lift pin elevating/lowering unit 7, each lift pin 4 is moved vertically in an interval from a lower position, at which a supporting portion at an upper end thereof is positioned at a height not higher than a heating surface 6a that is an upper surface of the heater unit 6, to an upper position of supporting and lifting the lower surface of the substrate W from the chuck pins 20. The lift pins 4 and the lift pin elevating/lowering unit 7 constitute an example of a transferring unit that transfers the substrate W between the spin chuck 5 and the heater unit 6.

The lift pin elevating/lowering unit 7 includes, for example, a ball screw mechanism and an electric motor that applies a driving force thereto. The lift pin elevating/lowering unit 7 can thereby position the lift pins 4 at any intermediate positions between the lower positions and the upper positions. For example, the substrate W can be heated by radiant heat from the heating surface 6a in a state where the height of the lift pins 4 is controlled so as to support the substrate W at a height of being separated by a predetermined interval upward from the heating surface 6a of the heater unit 6. Also, if the substrate W is placed on the heating surface 6a of the heater unit 6, the substrate W can be heated by a greater heat amount, by thermal conduction from the heating surface 6a in a contacting state of contacting the lower surface of the substrate W. And by positioning the lift pins 4 at a height at which the substrate W can be supported at a height of the chuck pins 20, the substrate W can be received/passed between the lift pins 4 and the chuck pins 20. Further, by positioning the lift pins 4 at a height at which the substrate W can be supported at a height higher than the chuck pins 20, the substrate W can be received/passed between the transfer robot CR and the lift pins 4.

The first moving nozzle 11 is moved in the horizontal direction and the vertical direction by means of a first nozzle moving unit 15. The first moving nozzle 11 can be moved, by movement in the horizontal direction, between a processing position of facing a rotation center of an upper surface of the substrate W and supplying a processing fluid to the substrate W and a home position (retracted position) of not facing the upper surface of the substrate W. The rotation center of the upper surface of the substrate W is a position of the upper surface of the substrate W that intersects the rotational axis A1. The home position of not facing the upper surface of the substrate W is a position which, in plan view, is at an outer side of the spin base 21 and, more specifically, may be a position at an outer side of the cup 8. By movement in the vertical direction, the first moving nozzle 11 can be brought close to the upper surface of the substrate W or can be retracted upward from the upper surface of the substrate W. The first nozzle moving unit 15 includes, for example, a pivoting shaft 15a oriented along the vertical direction, an arm 15b coupled to the pivoting shaft 15a and extending horizontally, and an arm driving mechanism 15c driving the arm 15b. The arm driving mechanism 15c makes the arm 15b swing by making the pivoting shaft 15a pivot around a vertical pivoting axis and moves the arm 15b vertically by elevating and lowering the pivoting shaft 15a along the vertical direction. The first moving nozzle 11 is fixed to the arm 15b. The first moving nozzle 11 moves in the horizontal direction and a perpendicular direction in accordance with the swinging and elevating/lowering of the arm 15b.

The first nozzle moving unit 15 thus has a function of a nozzle holding unit that holds the first moving nozzle 11 so as to face the upper surface of the substrate W held by the spin chuck 5. Further, the first nozzle moving unit 15 has a function of a distance adjusting unit that adjusts a distance in the vertical direction between the substrate W, held by the spin chuck 5, and the first moving nozzle 11.

The second moving nozzle 12 is moved in the horizontal direction and the perpendicular direction by a second nozzle moving unit 16. The second moving nozzle 12 can be moved, by movement in the horizontal direction, between a position of facing the rotation center of the upper surface of the substrate W and supplying a processing fluid to the substrate W and a home position (retracted position) of not facing the upper surface of the substrate W. The home position is a position which, in plan view, is at the outer side of the spin base 21 and, more specifically, may be a position at the outer side of the cup 8. By movement in the vertical direction, the second moving nozzle 12 can be brought close to the upper surface of the substrate W or can be retracted upward from the upper surface of the substrate W. The second nozzle moving unit 16 includes, for example, a pivoting shaft oriented along the vertical direction, an arm coupled to the pivoting shaft and extending horizontally, and an arm driving mechanism driving the arm. The arm driving mechanism makes the arm swing by making the pivoting shaft pivot around a vertical pivoting axis and moves the arm vertically by elevating and lowering the pivoting shaft along the vertical direction. The second moving nozzle 12 is fixed to the arm. The second moving nozzle 12 moves in the horizontal direction and the perpendicular direction in accordance with the swinging and elevating/lowering of the arm.

In the present preferred embodiment, the first moving nozzle 11 has a function of an organic solvent nozzle that discharges an organic solvent and a function of a gas nozzle that discharges an inert gas, such as nitrogen gas, etc. An organic solvent supply pipe 35 (processing liquid supply pipe) and first to third inert gas supply pipes 36A, 36B, and 36C are coupled to the first moving nozzle 11. The organic solvent supply pipe 35 has interposed therein an organic solvent valve 37 (processing liquid valve) that opens and closes a flow passage thereof. The inert gas supply pipes 36A, 36B, and 36C respectively have interposed therein first to third inert gas valves 38A, 38B, and 38C that open and close respective flow passages thereof. Also, the inert gas supply pipe 36A has interposed therein a mass flow controller 39A (flow regulating unit) arranged to accurately adjust a flow rate of an inert gas flowing through the flow passage thereof. Also, the inert gas supply pipe 36B has interposed therein a variable flow valve 39B arranged to adjust a flow rate of an inert gas flowing through the flow passage thereof, and the inert gas supply pipe 36C has interposed therein a variable flow valve 39C arranged to adjust a flow rate of an inert gas flowing through the flow passage thereof. Further, the inert gas supply pipes 36A, 36B, and 36C respectively have interposed therein filters 40A, 40B, and 40C arranged to remove foreign matter.

An organic solvent, such as isopropyl alcohol (IPA), etc., from an organic solvent supply source is supplied to the organic solvent supply pipe 35. Inert gases, such as nitrogen gas (N2), etc., are respectively supplied from inert gas supply sources to the inert gas supply pipes 36A, 36B, and 36C.

The first moving nozzle 11 is a fluid nozzle having a plurality of discharge ports. The first moving nozzle 11 has a linear stream discharge port 81 that discharges a fluid (an inert gas in the present preferred embodiment) in a straight line perpendicular to the upper side major surface of the substrate W along a central axis 80 disposed perpendicular to the major surface of the substrate W. The inert gas from the inert gas supply pipe 36A is supplied to the linear stream discharge port 81. Further, the first moving nozzle 11 has a first parallel stream discharge port 82 radially discharging a fluid (an inert gas in the present preferred embodiment) to a periphery of the central axis 80 along a plane perpendicular to the central axis 80. The inert gas from the inert gas supply pipe 36B is supplied to the first parallel stream discharge port 82. Also, the first moving nozzle 11 has, below the first parallel stream discharge port 82, a second parallel stream discharge port 83 radially discharging a fluid (an inert gas in the present preferred embodiment) to a periphery of the central axis 80 along a plane perpendicular to the central axis 80. The inert gas from the inert gas supply pipe 36C is supplied to the second parallel stream discharge port 83. The first moving nozzle 11 further includes an organic solvent nozzle 84 that discharges an organic solvent along the central axis 80 toward the upper surface of the substrate W. The organic solvent from the organic solvent supply pipe 35 is supplied to the organic solvent nozzle 84.

The inert gas discharged from the linear stream discharge port 81 forms a linear gas stream 85 that is perpendicularly incident on the major surface of the substrate W. The inert gas discharged from the first parallel stream discharge port 82 forms a first parallel gas stream 86 parallel to the upper surface of the substrate W and covering the upper surface of the substrate W. The inert gas discharged from the second parallel stream discharge port 83 forms, below the first parallel gas stream 86, a second parallel gas stream 87 parallel to the upper surface of the substrate W and covering the upper surface of the substrate W. The first and second parallel gas streams 86 and 87 merge to form a laminar stream that flows along the upper surface of the substrate W. The inert gas discharged from the linear stream discharge port 81 collides against the upper surface of the substrate W and thereafter forms a gas stream flowing radially along the upper surface of the substrate W. This gas stream also constitutes a portion of the laminar flow.

In the present preferred embodiment, the second moving nozzle 12 has a function of a chemical liquid nozzle supplying a chemical liquid, such as an acid, alkali, etc. More specifically, the second moving nozzle 12 may have a form of a double-fluid nozzle capable of mixingly discharging a liquid and a gas. The double-fluid nozzle may be used as a straight nozzle when it is made to discharge the liquid with the supply of the gas being stopped. A chemical liquid supply pipe 41 and an inert gas supply pipe 42 are coupled to the second moving nozzle 12. The chemical liquid supply pipe 41 has interposed therein a chemical liquid valve 43 that opens and closes a flow passage thereof. The inert gas supply pipe 42 has interposed therein an inert gas valve 44 that opens and closes a flow passage thereof. A chemical liquid, such as an acid, alkali, etc., from a chemical liquid supply source is supplied to the chemical liquid supply pipe 41. An inert gas, such as nitrogen gas (N2), etc., from an inert gas supply source is supplied to the inert gas supply pipe 42.

An etching liquid and a cleaning liquid are specific examples of the chemical liquid. More specifically, the chemical liquid may be hydrofluoric acid, SC1 (ammonia-hydrogen peroxide mixture), SC2 (hydrochloric acid-hydrogen peroxide mixture), buffered hydrofluoric acid (mixed liquid of hydrofluoric acid and ammonium fluoride), etc.

In the present preferred embodiment, the DIW nozzle 10 is a fixed nozzle disposed to discharge DIW (an example of a fluid) toward the rotation center of the upper surface of the substrate W. DIW from a DIW supply source is supplied via a DIW supply pipe 46 to the DIW nozzle 10. The DIW supply pipe 46 has interposed therein a DIW valve 47 arranged to open and close a flow passage thereof. The DIW nozzle 10 is not required to be a fixed nozzle and may be a moving nozzle that moves at least in the horizontal direction.

The lower surface nozzle 9 is inserted through the hollow supporting shaft 30 and further penetrates through the heater unit 6. The lower surface nozzle 9 has at its upper end, a discharge port 9a facing a lower surface center of the substrate W. A processing fluid from a processing fluid supply source is supplied via a fluid supply pipe 48 to the lower surface nozzle 9. The processing fluid that is supplied may be a liquid or may be a gas. The fluid supply pipe 48 has interposed therein a fluid valve 49 arranged to open and close a flow passage thereof.

Figure 3:
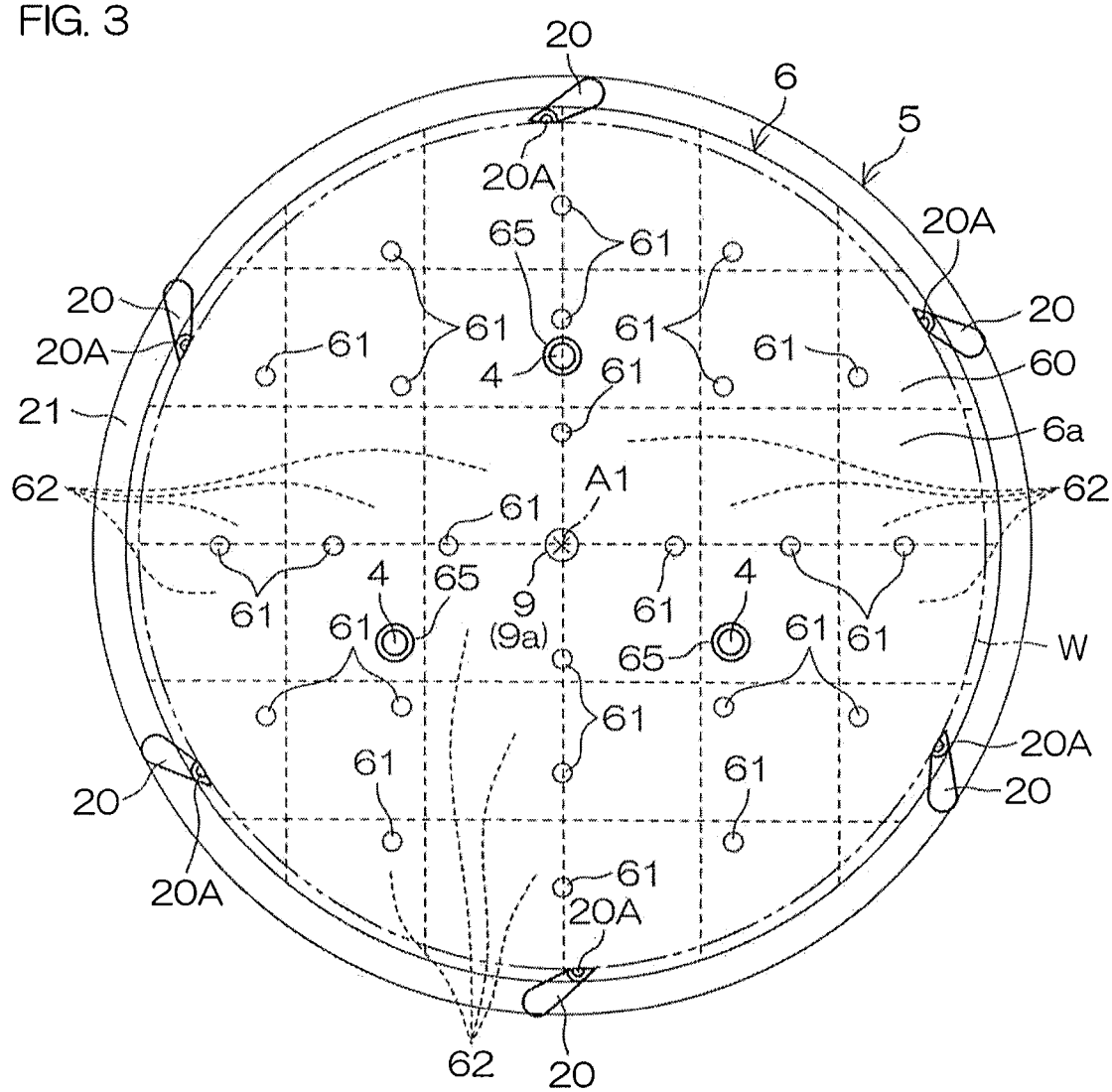
FIG. 3 is a plan view of lift pins, a spin chuck, and a heater unit included in the processing unit.
Figure 3A:
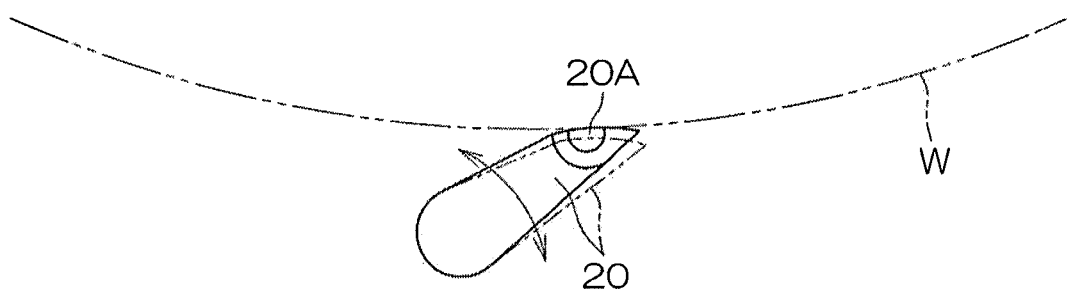
FIG. 3A is an enlarged plan view of a chuck pin.

FIG. 3 is a plan view of the lift pins 4, the spin chuck 5, and the heater unit 6. The spin base 21 of the spin chuck 5 has, in plan view, a circular shape centered at the rotational axis A1 and a diameter thereof is greater than a diameter of the substrate W. The plurality (six, in the present preferred embodiment) of chuck pins 20 are disposed at intervals at the peripheral edge portion of the spin base 21. Each of the plurality of chuck pins 20 has a clamping portion 20A arranged to contact a peripheral end surface of the substrate W and clamp the substrate W. The plurality of chuck pins 20 can take on a closed state (state illustrated in enlarged manner by solid lines in FIG. 3A) of contacting the peripheral end surface of the substrate W and clamping the substrate W and an open state (state illustrated by alternate long and two short dashes lines in FIG. 3A) where the clamping portions 20A are retracted from the peripheral end surface of the substrate W and release the clamping. When the plurality of chuck pins 20 are in the open state, the substrate W in the horizontal orientation can be moved vertically between a height higher than the clamping portions 20A and a height lower than the clamping portions 20A without interference with the clamping portions 20A at an inner side of the clamping portions 20A of the plurality of chuck pins 20. That is, when the plurality of chuck pins 20 are in the open state, a diameter of a circle passing through innermost edges of the clamping portions 20A of the plurality of chuck pins 20 is greater than a diameter of the substrate W.

The heater unit 6 has a form of a disk-shaped hot plate and includes a main plate body 60, supporting pins 61, and a heater 62. The main plate body 60 is arranged, in plan view, to have a circular shape larger than the outer shape of the substrate W and centered at the rotational axis A1. More specifically, the main plate body 60 has a circular planar shape with a diameter greater than the diameter of the substrate W. An outermost periphery (the entire outermost periphery in the present preferred embodiment) of the substrate W thus overlaps with the heating surface 6a in top view. In the present preferred embodiment, an entirety of the substrate W overlaps with the heating surface 6a in top view.

An upper surface of the main plate body 60 is a flat surface oriented along a horizontal plane. The plurality of supporting pins 61 (see also FIG. 2) project from the upper surface of the main plate body 60. Each supporting pin 61 is, for example, hemispherical and projects by only a minute height (for example, of 0.1 mm) from the upper surface of the main plate body 60. Therefore, when the substrate W is contactingly supported by the supporting pins 61, the lower surface of the substrate W faces the upper surface of the main plate body 60 across a minute interval of, for example, 0.1 mm. The substrate W can thereby be heated efficiently and uniformly. The supporting pins 61 are disposed substantially evenly on the upper surface of the main plate body 60.

The upper surface of the main plate body 60 does not have to have the supporting pins 61. If the supporting pins 61 are not provided, the substrate W may be put in contact with the upper surface of the main plate body 60. If the supporting pins 61 are provided, the heating surface 6a of the heater unit 6 includes the upper surface of the main plate body 60 and front surfaces of the supporting pins 61. Also, if the supporting pins 61 are not provided, the upper surface of the main plate body 60 corresponds to being the heating surface 6a. In the description that follows, a state where the supporting pins 61 are in contact with the lower surface of the substrate W may be referred to as the heating surface 6a being in contact with the lower surface of the substrate W, etc.

The heater 62 may be a resistor body incorporated in the main plate body 60. FIG. 3 shows a heater 62 that is partitioned into a plurality of regions. By energizing the heater 62, the heating surface 6a is heated to a temperature higher than room temperature (for example, 20 to 30° C., for example 25° C.). Specifically, by energizing the heater 62, the heating surface 6a can be heated to a temperature (for example, 195° C.) that is higher than a boiling point of the organic solvent supplied from the first moving nozzle 11. As shown in FIG. 2, a feeder 63 to the heater 62 is passed inside the supporting shaft 30. A heater energization unit 64, which supplies electric power to the heater 62, is connected to the feeder 63. The heater energization unit 64 may be energized constantly during operation of the substrate processing apparatus 1.

In the present example, three of the lift pins 4 are provided. The three lift pins 4 are respectively disposed at positions corresponding to apexes of an equilateral triangle having a center of gravity on the rotational axis A1. The lift pins 4 extend in the vertical direction along the rotational axis A1 and are respectively inserted through penetrating holes 65 penetrating through the main plate body 60 in the vertical direction. Tips (upper ends) of the lift pins 4 are supporting portions that contact the lower surface of the substrate W and support the substrate W. The three lift pins 4 are coupled to the elevating/lowering shaft 31 below the heater unit 6. The three lift pins 4 are disposed to oppose the lower surface of the substrate W at three locations further inward than an outer peripheral edge of the substrate W in top view.

Figure 4:
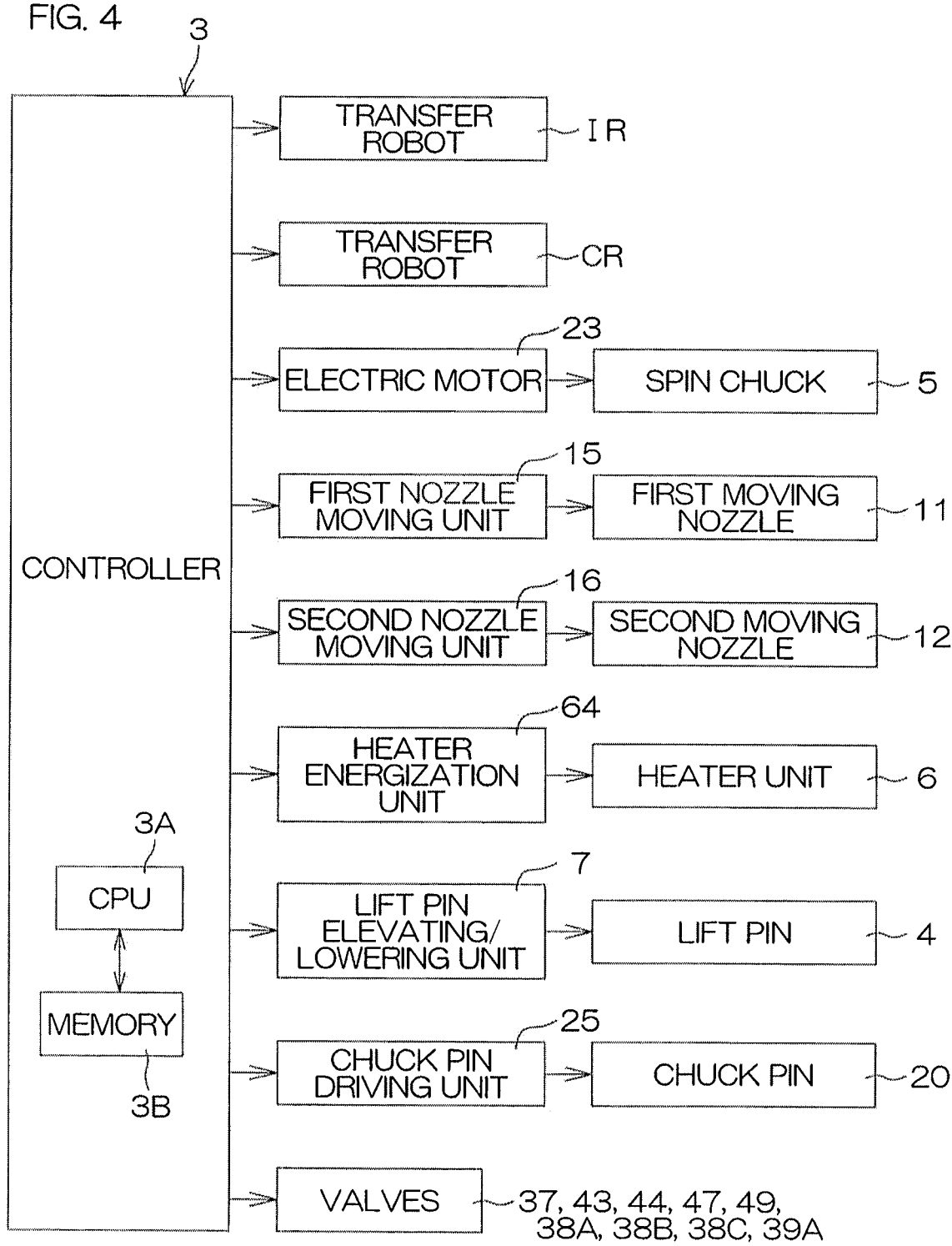
FIG. 4 is a block diagram for describing the electrical arrangement of a main portion of the substrate processing apparatus.

FIG. 4 is a block diagram for describing the electrical arrangement of a main portion of the substrate processing apparatus 1. The controller 3 includes a microcomputer and controls control objects included in the substrate processing apparatus 1 in accordance with a predetermined control program. More specifically, the controller 3 includes a processor (CPU) 3A and a memory 3B, storing the control program, and is arranged so that various controls for substrate processing are executed by the processor 3A executing the control program. In particular, the controller 3 controls operations of the transfer robots IR and CR, the electric motor 23 that performs rotational drive of the spin chuck 5, the first nozzle moving unit 15, the second nozzle moving unit 16, the heater energization unit 64, the lift pin elevating/lowering unit 7 that elevates and lowers the lift pins 4, the chuck pin driving unit 25, the valves 37, 43, 44, 47, and 49, etc. The controller 3 also performs opening and closing control of the first to third inert gas valves 38A, 38B, and 38C. The controller 3 further controls an opening degree of the mass flow controller 39A to control the flow rate of the inert gas passing through the inert gas supply pipe 36A.

Figure 5:
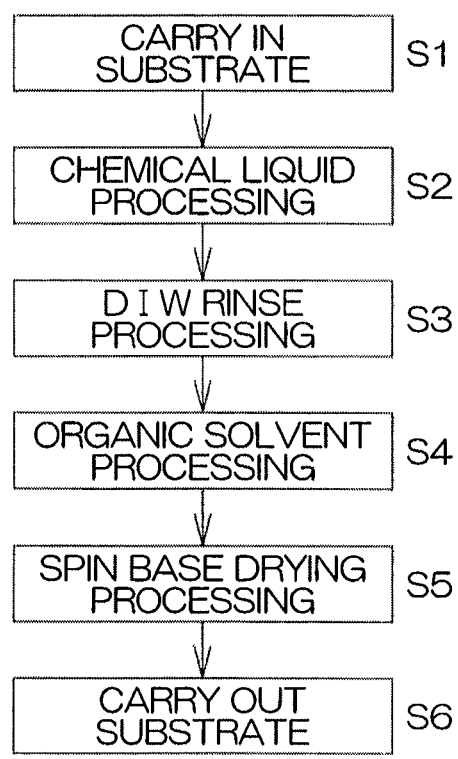
FIG. 5 is a flow diagram for describing an example of substrate processing by the substrate processing apparatus.

FIG. 5 is a flow diagram for describing an example of substrate processing by the substrate processing apparatus 1 and mainly shows a processing realized by the controller 3 executing an operation program. Also, FIG. 6A to FIG. 6M show conditions inside the chamber 13 of the processing unit 2 in main steps.

An unprocessed substrate W is carried into a processing unit 2 from a carrier C and transferred to the spin chuck 5 via the lift pins 4 by the transfer robots IR and CR (S1). In this process, the controller 3 controls the lift pin elevating/lowering unit 7 so that the lift pins 4 are positioned at the upper positions. Also, the controller 3 controls the chuck pin driving unit 25 so that the chuck pins 20 are put in the open state. In that state, the transfer robot CR transfers the substrate W to the lift pins 4 (see FIG. 6A). Thereafter, the controller 3 controls the lift pin elevating/lowering unit 7 to lower the lift pins 4 to receiving/passing heights at which the height of the substrate W becomes a height of substrate support by the chuck pins 20 of the spin chuck 5. In that state, the controller 3 controls the chuck pin driving unit 25 to put the chuck pins 20 in the closed state (see FIG. 6B). The substrate W is thereby clamped by the chuck pins 20 and the substrate W is held upon being passed from the lift pins 4 to the spin chuck 5 (substrate holding step). Thereafter, the controller 3 controls the lift pin elevating/lowering unit 7 to lower the lift pins 4 and make tip portions thereof separate from the lower surface of the substrate W (see FIG. 6C). For example, the controller 3 may control the lift pin elevating/lowering unit 7 to lower the lift pins 4 to the lower positions so that the heights of the tips thereof are not higher than the heating surface 6a of the heater unit 6.

After the transfer robot CR has retracted outside the processing unit 2, a chemical liquid processing (S2) is started. The controller 3 drives the electric motor 23 to rotate the spin base 21 at a predetermined chemical liquid rotational speed (for example, of 300 rpm) (substrate rotating step). Meanwhile, the controller 3 controls the second nozzle moving unit 16 to position the second moving nozzle 12 at a chemical liquid processing position above the substrate W (see FIG. 6D). The chemical liquid processing position may be a position at which the chemical liquid discharged from the second moving nozzle 12 lands on the rotation center of the upper surface of the substrate W. The controller 3 then opens the chemical liquid valve 43. The chemical liquid is thereby supplied from the second moving nozzle 12 toward the upper surface of the substrate W in the rotating state (processing fluid supplying step). The supplied chemical liquid spreads across an entire surface of the substrate W due to a centrifugal force.

After the chemical processing of a fixed time, a DIW rinse processing (S3) of replacing the chemical liquid on the substrate W with DIW to remove the chemical liquid from above the substrate W is executed. Specifically, the controller 3 closes the chemical liquid valve 43 and opens the DIW valve 47 in its place. The DIW from the DIW nozzle 10 is thereby supplied toward the upper surface of the substrate W in the rotating state (with the rotational speed being, for example, 300 rpm) (see FIG. 6E; processing fluid supplying step). The supplied DIW spreads across the entire surface of the substrate W due to the centrifugal force. The chemical liquid on the substrate W is rinsed off by the DIW. During this process, the controller 3 controls the second nozzle moving unit 16 to make the second moving nozzle 12 retract from above the substrate W to a side of the cup 8.

After the DIW rinse processing of a fixed time, an organic solvent processing (S4) of replacing the DIW on the substrate W with an organic solvent, which is a processing liquid of lower surface tension (low surface tension liquid), is executed.

The controller 3 controls the first nozzle moving unit 15 to make the first moving nozzle 11 move to an organic solvent rinse position above the substrate W. The organic solvent rinse position may be a position at which the organic solvent (for example, IPA), discharged from the organic solvent nozzle 84 included in the first moving nozzle 12, lands on the rotation center of the upper surface of the substrate W.

The controller 3 then opens the inert gas valves 38B and 38C. From the first parallel stream discharge port 82 and the second parallel stream discharge port 83 of the first moving nozzle 11, the inert gas is thereby discharged radially and parallel to the upper surface of the substrate W from the center to a peripheral edge of the substrate W (see FIG. 6F). The parallel gas streams 86 and 87, which are inert gas streams that flow parallel to the upper surface of the substrate W, are thereby formed, and an entirety of the upper surface of the substrate W (to be accurate, a region at an outer side of the first moving nozzle 11 in plan view) is covered by the parallel gas streams 86 and 87 (upper surface covering step).

In that state, the controller 3 closes the DIW valve 47 to end the DIW rinse processing and opens the organic solvent valve 37. The organic solvent (liquid) is thereby supplied from the first moving nozzle 11 (organic solvent nozzle 84) toward the upper surface of the substrate W in the rotating state (with the rotational speed being, for example, 300 rpm) (processing fluid supplying step). The supplied organic solvent spreads across the entire surface of the substrate W due to the centrifugal force and replaces the DIW on the substrate W. A liquid film 150 of the organic solvent is thereby formed on the upper surface of the substrate W (liquid film forming step).

When the liquid film 150 of the organic solvent is formed on the entire upper surface of the substrate W, the controller 3 decelerates (for example, gradually decelerates) the rotation of the spin chuck 5 to stop the rotation of the substrate W and closes the organic solvent valve 37 to stop the supplying of the organic solvent. A puddle state, in which the organic solvent liquid film 150 is supported on the substrate W in the stationary state, is thereby entered. In that state, the controller 3 controls the lift pin elevating/lowering unit 7 to elevate the lift pins 4 to the receiving/passing positions. The controller 3 then controls the chuck pin driving unit 25 to make the chuck pin 20 open. The substrate W is thereby passed from the spin chuck 5 to the lift pins 4 (see FIG. 6G; portion of transferring step). Thereafter, the controller 3 controls the lift pin elevating/lowering unit 7 to lower the lift pins 4 to the lower positions. The lift pins 4 are thereby set to heights not higher than the heating surface 6*a* of the heater unit 6 and the substrate W is passed from the lift pins 4 to the heating surface 6*a* of the heater unit 6 (see FIG. 6H; portion of transferring step). The heating surface 6*a* is thereby put in contact with the lower surface of the substrate W and the substrate W is heated quickly by thermal conduction from the heater unit 6 (substrate heating step). The heating surface 6*a* is larger than the substrate W and therefore an entirety of the lower surface of the substrate W is put in a state of contacting (or facing) the heating surface 6*a*.

The supplying of the organic solvent may be stopped after the lower surface of the substrate W contacts the heating surface 6*a* of the heater unit 6. By the substrate W contacting the heating surface 6*a*, the substrate W is heated rapidly and the temperature of the organic solvent is thereby made to rise quickly. In this process, a hole may open at an unspecific position in the liquid film 150 of the organic solvent. Thus by arranging to stop the supplying of the organic solvent after the lower surface of the substrate W contacts the heating surface 6*a* of the heater unit 6, the opening of a hole in the liquid film 150 of the organic solvent due to evaporation of the organic solvent accompanying the rapid temperature rise of the substrate W can be avoided.

A portion of the organic solvent in contact with the upper surface of the substrate W evaporates due to the heating of the substrate W and a gas phase layer is thereby formed between the organic solvent liquid film 150 and the upper surface of the substrate W. The removal, to be described below, of the organic solvent liquid film 150 from the substrate W upper surface is executed in this state where the liquid film is supported by the gas phase layer.

In removing the organic solvent liquid film 150, the controller 3 controls the first nozzle moving unit 15 to move the first moving nozzle 11 so that the linear stream discharge port 81 is positioned on the rotational axis A1 of the substrate W. The controller 3 then opens the inert gas valve 38A to make the inert gas of a low flow rate (for example, of 3 liters/minute) be discharged rectilinearly (as the linear gas flow 85) from the linear stream discharge port 81 toward the organic solvent liquid film 150 above the substrate W (perpendicular gas discharging step; see FIG. 6I). Thereby, at the position at which the discharge of the inert gas is received, that is, at the center of the substrate W, the organic solvent liquid film 150 is removed by the inert gas and a hole 151, exposing the front surface of the substrate W, is opened in a center of the organic solvent liquid film 150 (hole opening step). By spreading the hole 151, the organic solvent above the substrate W is expelled off the substrate W (liquid film removing step).

By the hole 151 being opened in the liquid film 150, the temperature of the substrate W becomes comparatively high in a region at an inner side of the hole 151 and the temperature of the substrate W becomes comparatively low in a region at an outer side of the hole 151. Due to the temperature gradient, the liquid film 150 moves from the high temperature side to the low temperature side and the hole 151 is thereby made to spread. In addition, the flow rate of the inert gas discharged from the linear flow discharge port 81 may be increased to a high flow rate (for example, of 30 liters/minute) to assist the liquid film removal by hole spreading (see FIG. 6J). The organic solvent processing is ended at a point at which the hole 151 is spread to the peripheral edge of the substrate W.

After the organic solvent processing is thus ended, the controller 3 controls the lift pin elevating/lowering unit 7 to elevate the lift pins 4 to the receiving/passing positions. In that state, the controller 3 controls the chuck pin driving unit 25 to put the chuck pins 20 in the closed state. The substrate W is thereby passed from the lift pins 4 to the chuck pins 20 (see FIG. 6K). The controller 3 then controls the lift pin elevating/lowering unit 7 to make the tips of the lift pins 4 separate downward from the lower surface of the substrate W. Further the controller 3 controls the electric motor 23 to make the substrate W undergo high-speed rotation at a drying rotational speed (for example, of 800 rpm). A spin base drying processing (S5: spin drying) for spinning off, by centrifugal force, the organic solvent that has dropped onto the spin base 21 is thereby performed (see FIG. 6L). In this process, the first moving nozzle 11 is disposed above the substrate W, discharges the linear gas flow 85 toward the substrate W and discharges the first and second parallel gas streams 86 and 87 toward radial directions parallel to the substrate W.

Thereafter, the controller 3 closes the inert gas valves 38A, 38B, and 38C to stop the discharges of inert gas from the first moving nozzle 11 and further controls the first nozzle moving unit 15 to make the first moving nozzle 11 retract. The controller 3 further controls the electric motor 23 to stop the rotation of the spin chuck 5. Also, the controller 3 controls the lift pin elevating/lowering unit 7 to elevate the lift pins 4 to the receiving/passing positions and controls the chuck pin driving unit 25 to put the chuck pins 20 in the open state. The substrate W is thereby passed from the chuck pins 20 to the lift pins 4 (see FIG. 6M).

Figure 6A:
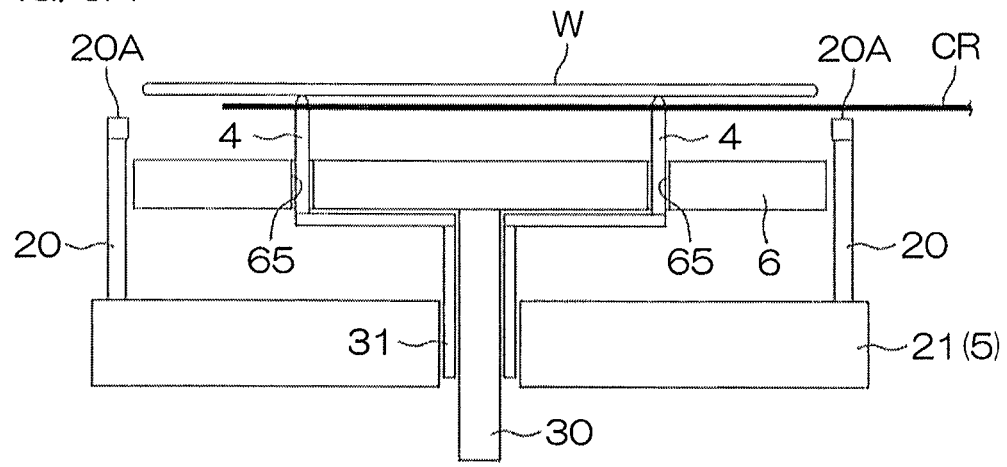
FIG. 6A to FIG. 6M show conditions inside a chamber of the processing unit in main steps of the substrate processing.
Figure 6B:
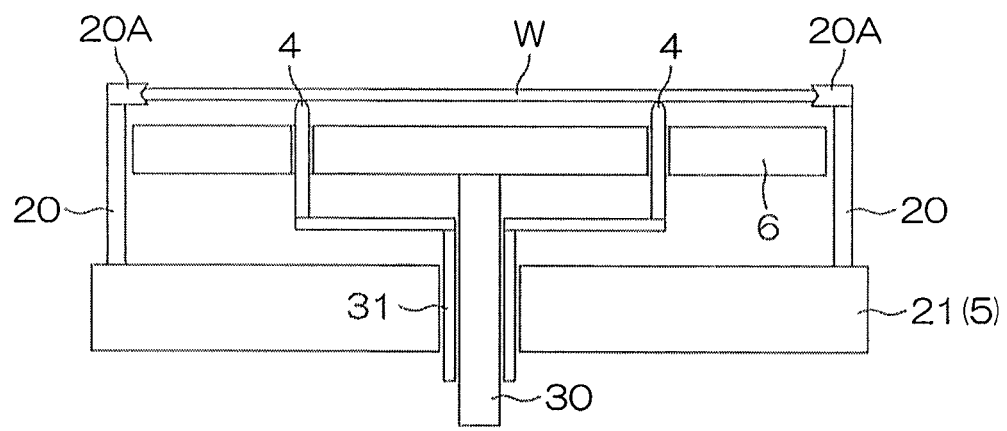
Figure 6C:
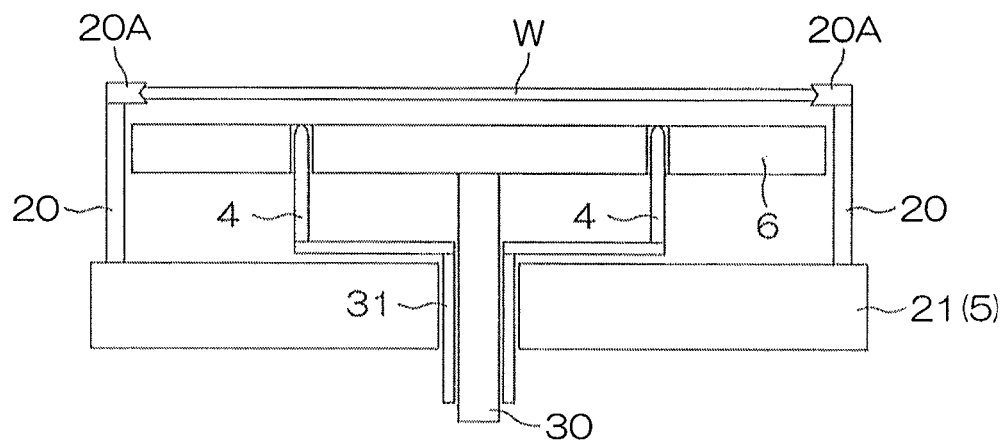
Figure 6D:
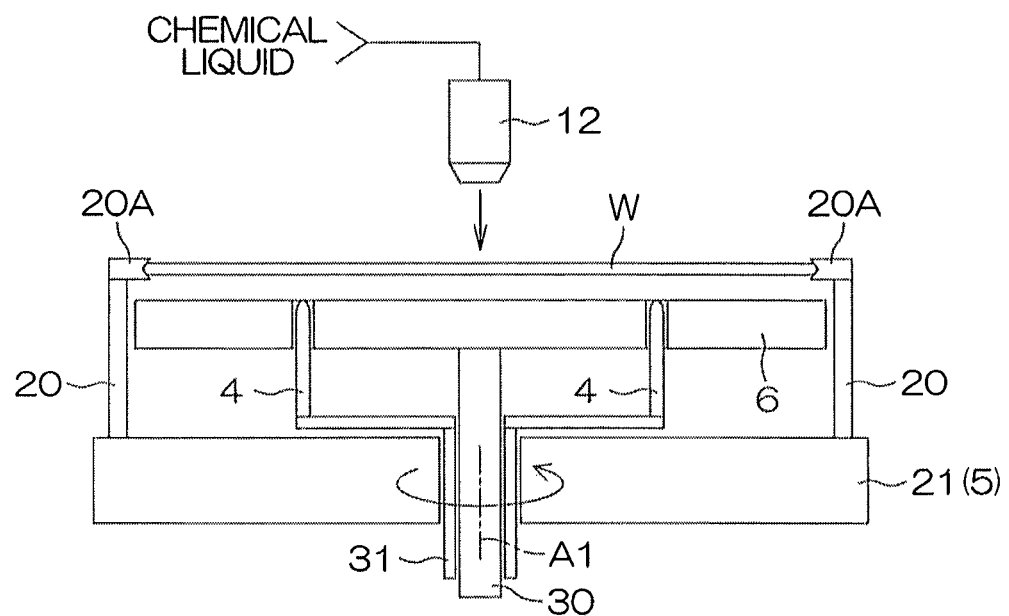
Figure 6E:
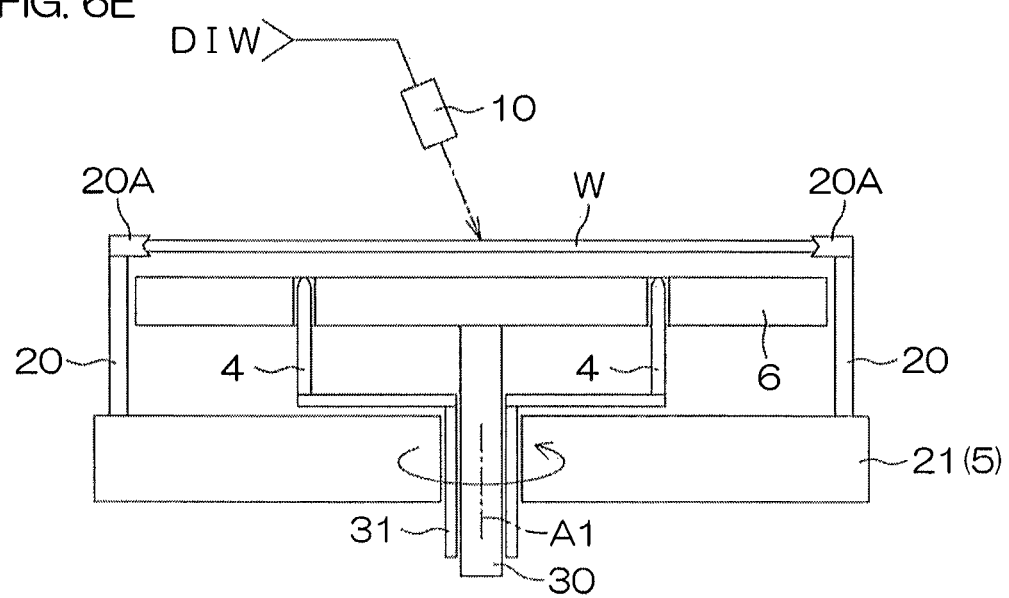
Figure 6F:
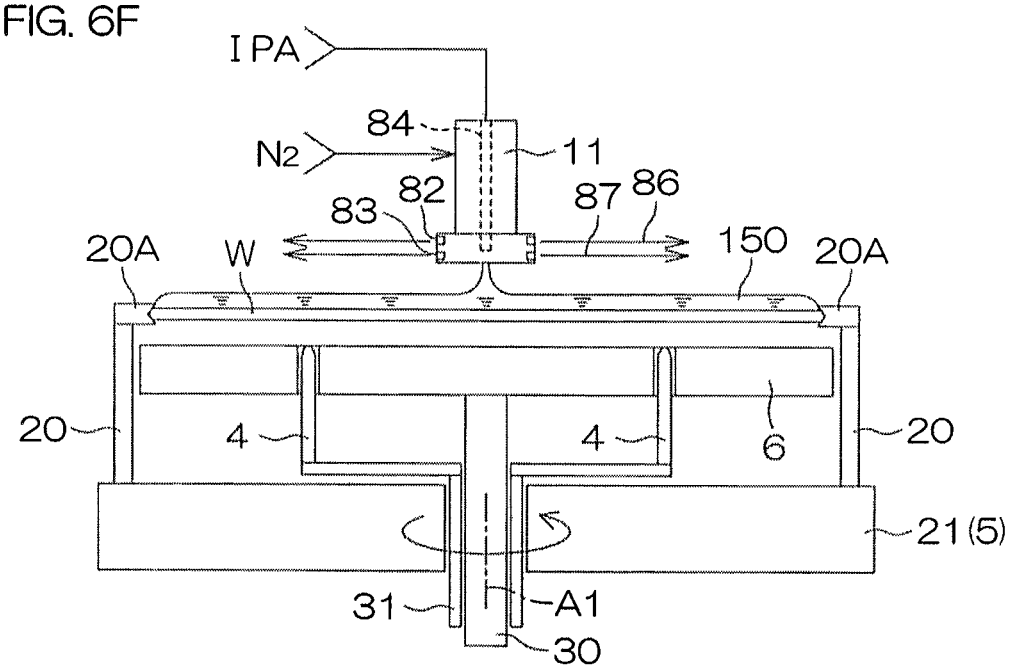
Figure 6G:
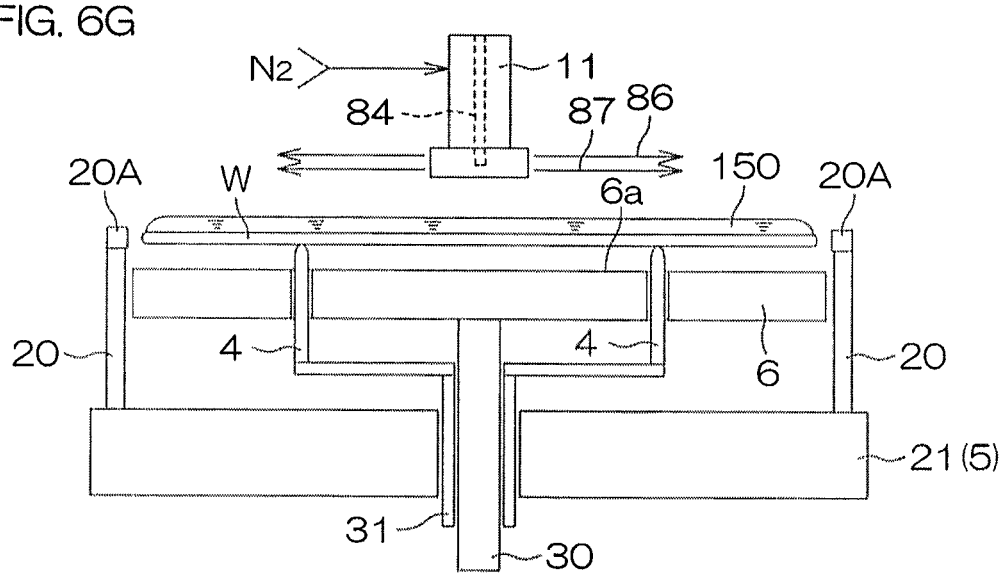
Figure 6H:
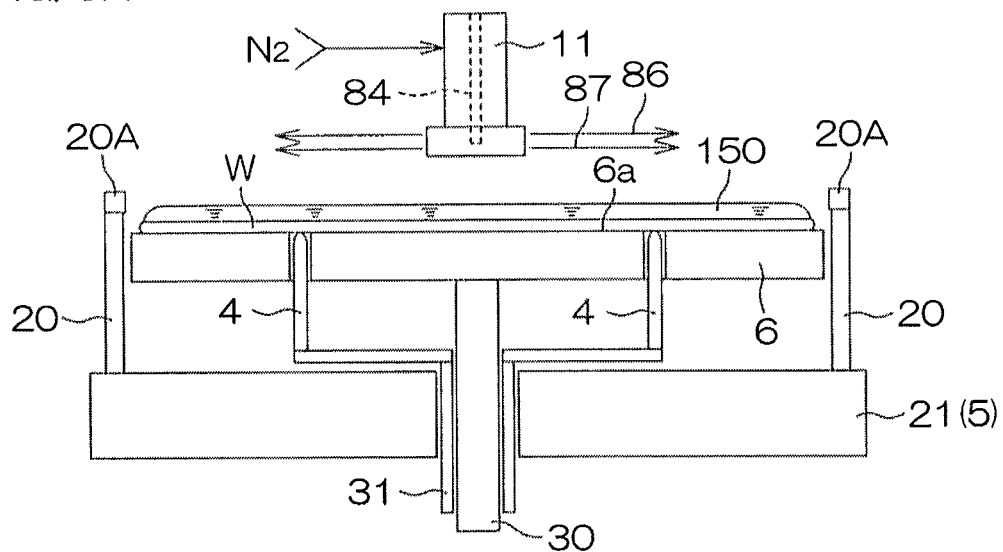
Figure 6I:
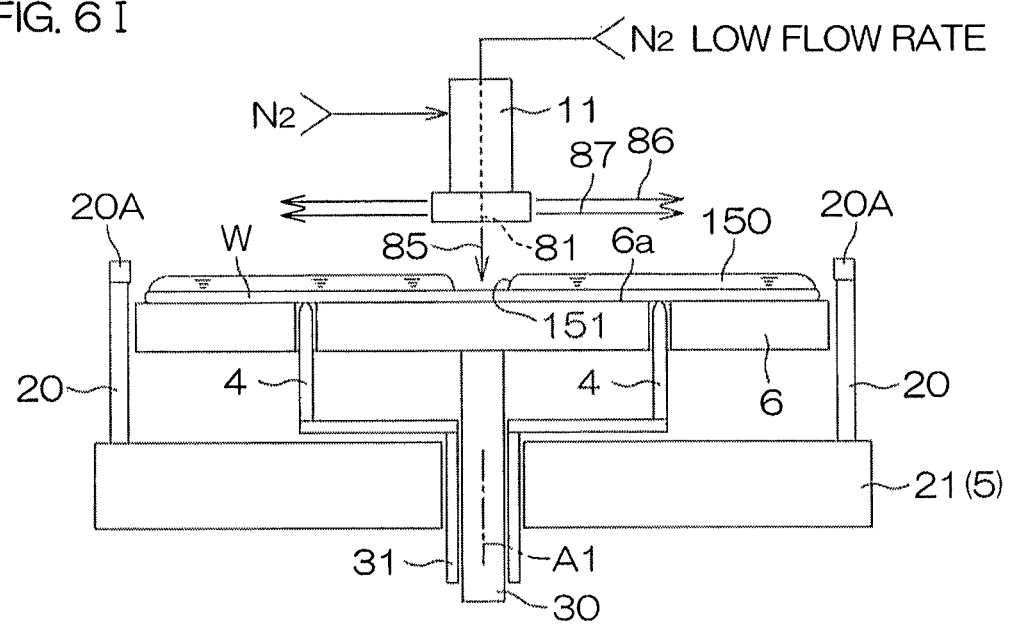
Figure 6J:
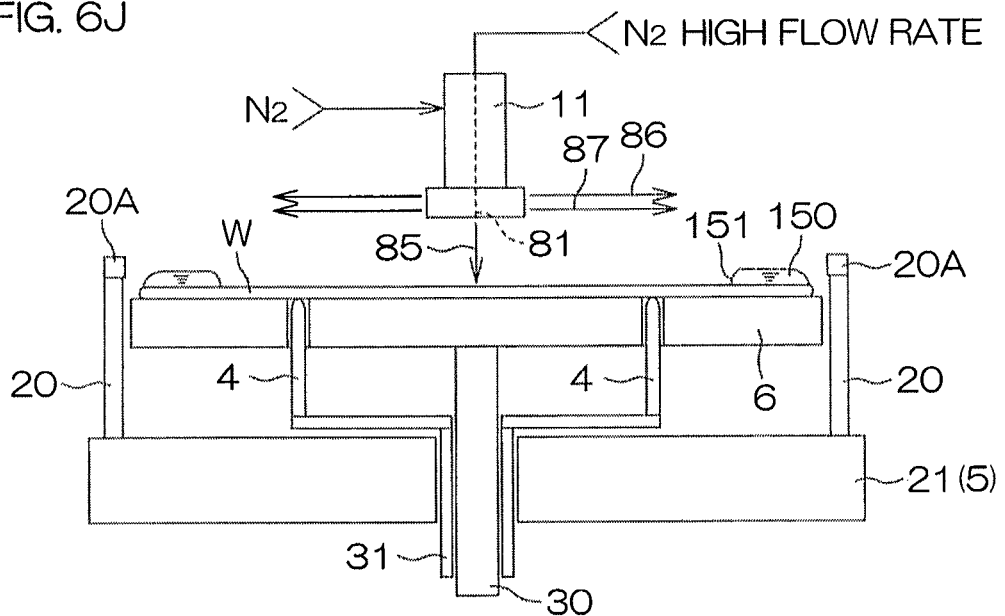
Figure 6K:
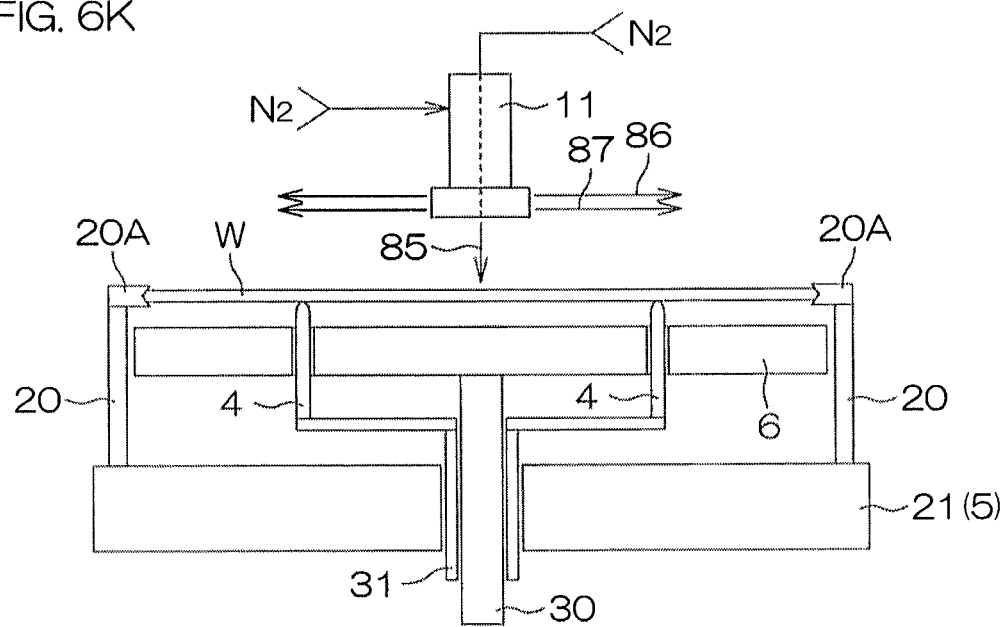
Figure 6L:
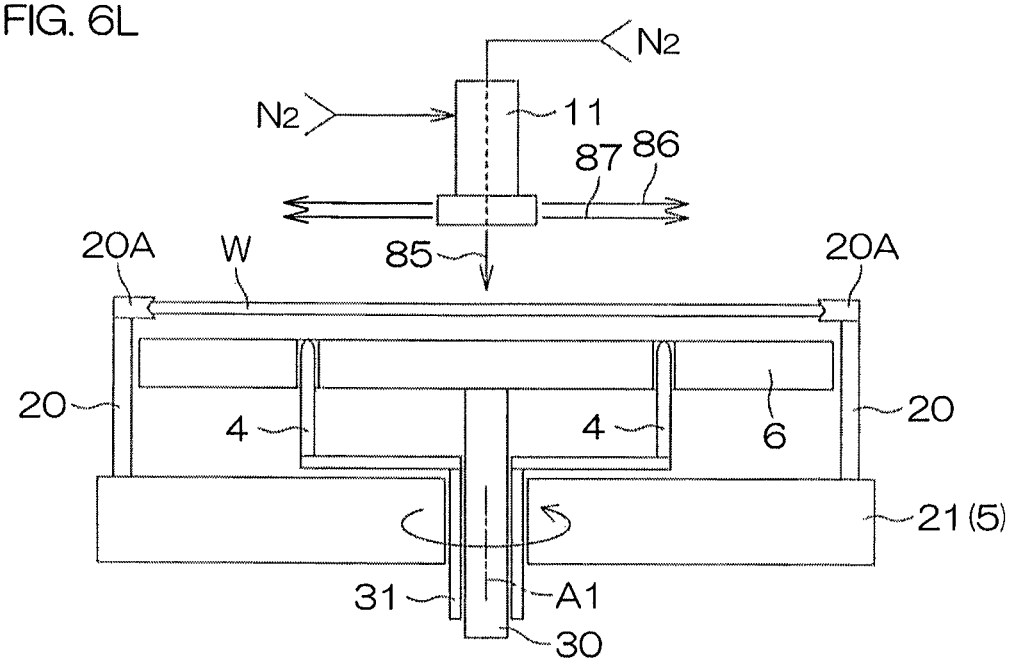
Figure 6M:
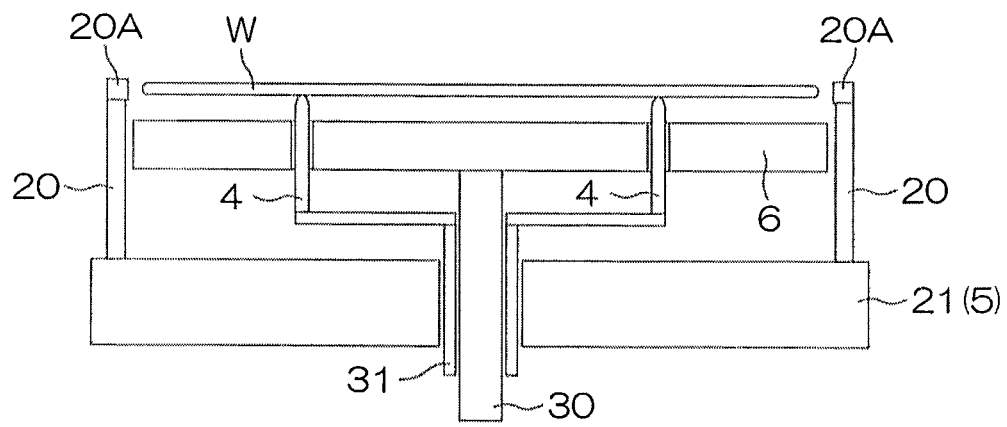

Thereafter, the controller 3 controls the lift pin elevating/lowering unit 7 to elevate the lift pins 4 to the upper position and lift up the substrate W to a carry-out height (see FIG. 6A). Thereafter, the transfer robot CR enters into the processing unit 2, scoops up the processed wafer W from the lift pins 4, and carries it outside the processing unit 2 (S6). The substrate W is transferred from the transfer robot CR to the transfer robot IR and is housed in a carrier C by the transfer robot IR.

FIG. 7A and FIG. 7B are illustrative sectional views for describing the forming of a gas phase layer at the front surface of the substrate W. A fine pattern 161 is formed on the front surface of the substrate W. The pattern 161 includes fine projecting structures 162 formed on the front surface of the substrate W. The structures 162 may include an insulator film or may include a conductor film. Also, the structures 162 may be laminated films formed by laminating a plurality of films. If line-shaped structures 162 are adjacent to each other, a groove (groove) is formed therebetween. In this case, a width W1 of each structure 162 may be approximately 10 nm to 45 nm and a mutual interval W2 between the structures 162 may be approximately 10 nm to several μm. A height T of each structure 162 may, for example, be approximately 50 nm to 5 μm. If the structure 162 is cylindrical, a hole is formed at the inner side thereof.

When the organic solvent is supplied to the substrate W, the organic solvent liquid film 150 formed on the front surface of the substrate W fills an interior (a space between adjacent structures 162 or an internal space of a cylindrical structure 162) of the pattern 161 as shown in FIG. 7A.

When the heating surface 6a of the heater unit 6 contacts the substrate W, the substrate W is heated and its temperature becomes higher than a boiling point of the organic solvent (82.4° C. in the case of IPA) by only a predetermined temperature (for example, 10 to 50° C.). The organic solvent in contact with the front surface of the substrate W thus evaporates and a gas of the organic solvent is generated to form a gas phase layer 152 as shown in FIG. 7B. The gas phase layer 152 fills the interior of the pattern 161 and further reaches an outer side of the pattern 161 to form an interface 155 (gas-liquid interface) with the organic solvent liquid film 150 at a position higher than upper surfaces 162A of the structures 162. The organic solvent liquid film 150 is supported on the interface 155. In this state, a liquid surface of the organic solvent is not in contact with the pattern 161 and therefore pattern collapse due to surface tension of the organic solvent liquid film 150 does not occur.

When the organic solvent evaporates due to heating of the substrate W, the organic solvent of the liquid phase is expelled instantaneously from inside the pattern 161. The organic solvent of the liquid phase is then supported on the formed gas phase layer 152 and is separated from the pattern 161. The gas phase layer 152 of the organic solvent is thus interposed between the upper surface of the pattern 161 (the upper surfaces 162A of the structures 162) and the organic solvent liquid film 150 and supports the organic solvent liquid film 150.

As shown in FIG. 7C, when a crack 153 forms in the organic solvent liquid film 150 that is floated from the upper surface of the substrate W, this becomes a cause of a defect, such as a watermark, etc., after drying, and the behavior of the liquid film 150 becomes unstable and may bring about pattern collapse. Therefore in the present preferred embodiment, the supplying of the organic solvent is stopped after stopping the rotation of the substrate W to form a thick organic solvent liquid film 150 on the substrate W and avoid the formation of a crack. When the heater unit 6 is put in contact with the substrate W, the rotation of the substrate W is stopped, so that the liquid film 150 will not become split due to the centrifugal force and the formation of a crack in the liquid film 150 can thus be avoided. Further, the output of the heater unit 6 is adjusted so that a vapor of the organic solvent will not break and blow out through the liquid film 150 and the formation of a crack is thereby avoided.

In the state where the organic solvent liquid film 150 is supported on the gas phase layer 152, a frictional resistance acting on the organic solvent liquid film 150 is small enough to be treated as zero. The organic solvent liquid film 150 is thus easily moved when a force in a direction parallel to the upper surface of the substrate W is applied to the organic solvent liquid film 150. In the present preferred embodiment, a hole is opened in the center of the organic solvent liquid film 150 to thereby cause a flow of the organic solvent to be formed by the temperature difference at the edge portion of the hole 151 and the liquid film 150 is pushed out from the inner side by the inert gas blown out from the linear stream discharge port 81 to move and remove the organic solvent liquid film 150 supported on the gas phase layer 152.

Each of FIG. 8A and FIG. 8B is a diagram for describing an effect due to an entirety of a lower surface of a substrate facing a heating surface of a heater unit. FIG. 8A shows temperature measurement results for a case where the entirety of the lower surface of the substrate overlaps with the heating surface (example). FIG. 8B shows temperature measurement results for a case where the diameter of the heating surface is smaller than the diameter of the substrate and the outer peripheral portion of the substrate does not face the heating surface (comparative example). In FIG. 8A and FIG. 8B, the vertical axis indicates the temperature of the substrate and the horizontal axis indicates time. A curve Lc indicates a temperature change of a substrate central portion, a curve Le indicates a temperature change of a substrate outer peripheral portion, and a curve Lm indicates a temperature change of an intermediate region between the substrate central portion and the substrate outer peripheral portion.

When at a time t1, the heating surface of the heater unit contacts the lower surface of the substrate, the temperature of the substrate begins to rise, and when at a time t2, the heating surface of the heater unit separates from the lower surface of the substrate, the temperature rise stops. With the example shown in FIG. 8A, the curves Lc, Le, and Lm are substantially matched and heating to substantially the same temperature (approximately 195° C.) as the heating surface 6a of the heater 62 is achieved without occurrence of temperature variation at the respective portions of the substrate. On the other hand, with the comparative example shown in FIG. 8B, although the curves Lc and Lm are substantially matched, the curve Le is shifted to a low temperature side. That is, in comparison to the central portion and the intermediate region of the substrate, the temperature rise is slow and a temperature difference (of, for example, approximately 20° C.) occurs after the stoppage of heating at the outer peripheral portion of the substrate. It can thus be understood that in-plane uniformity of substrate processing can be improved by using a heater unit having a heating surface of a size overlapping with an outer periphery of the substrate.

As described above, with the present preferred embodiment, the entirety of the substrate W can be processed by the processing fluid by supplying the processing fluid toward the substrate W while rotating the substrate W in a state where the substrate W is held by the spin chuck 5. On the other hand, the substrate W faces the heating surface 6a of the heater unit 6 and the outermost periphery of the substrate W overlaps with the heating surface 6a in top view, and therefore by transferring the substrate W from the spin chuck 5 to the heater unit 6, the entirety of the substrate W can be heated uniformly. Therefore both the processing by the processing fluid and the heating processing are performed uniformly on the entirety of the substrate W, and in-plane uniformity of substrate processing can thus be improved. Moreover, the lower surface of the substrate W contacts the heating surface 6a of the heater unit 6 and therefore the substrate W can be heated efficiently. Especially in the present preferred embodiment, the heating surface 6a overlaps with the entirety of the substrate W, held by the spin chuck 5, in top view. Therefore the entirety of the substrate W can be heated more uniformly.

Also in the present preferred embodiment, the chuck pins 20 of the spin chuck 5 are arranged to be retractable outward from between the substrate W and the heating surface 6a. The substrate W can thereby be heated in a state where any portion of the spin chuck 5 is not interposed between the substrate W and the heating surface 6a. The in-plane uniformity of substrate processing (especially heating) can thus be improved further. Also, the chuck pins 20 are retractable outward from between the substrate W and the heating surface 6a and therefore the substrate W can be transferred from the spin chuck 5 to the heater unit 6 to put the heating surface 6a in contact with the lower surface of the substrate W and the substrate W can also be transferred from the heater unit 6 to the spin chuck 5 without interfering with the chuck pins 20.

Further with the present preferred embodiment, by the arrangement that vertically moves the lift pins 4 disposed further inward than the chuck pins 20, the lower surface of the substrate W can be supported by the lift pins 4 and the substrate W can be transferred between the spin chuck 5 and the heater unit 6. The substrate W can thus be transferred between the spin chuck 5 and the heater unit 6 without inverting a vertical relationship thereof. The heater unit 6 having the larger heating surface 6a than the substrate W can thereby be designed without having to consider interference with the chuck pins 20.

With the present preferred embodiment, the DIW on the substrate W is replaced by the organic solvent and the liquid film 150 of the organic solvent is formed on the upper surface of the substrate W. By the heating surface 6a of the heater unit 6 contacting the entirety of the lower surface of the substrate W in that state, a uniform gas phase layer can be formed between the liquid film 150 and the upper surface of the substrate W throughout the entirety of the substrate W and the liquid film 150 can be floated by the gas phase layer. By the liquid film 150 being expelled outside the substrate W in the state, collapsing of the fine pattern formed on the upper surface of the substrate W can be avoided. Especially with the present preferred embodiment, the temperature of the substrate W can be raised and held uniformly at all of the central portion, intermediate region, and outer peripheral portion of the substrate W and therefore a uniform gas phase layer can be formed reliably throughout the entirety of the upper surface of the substrate W. Surface tension of the organic solvent can thereby be suppressed reliably from acting on the fine pattern and therefore the collapsing of the fine pattern can be suppressed reliably.

Figure 9:
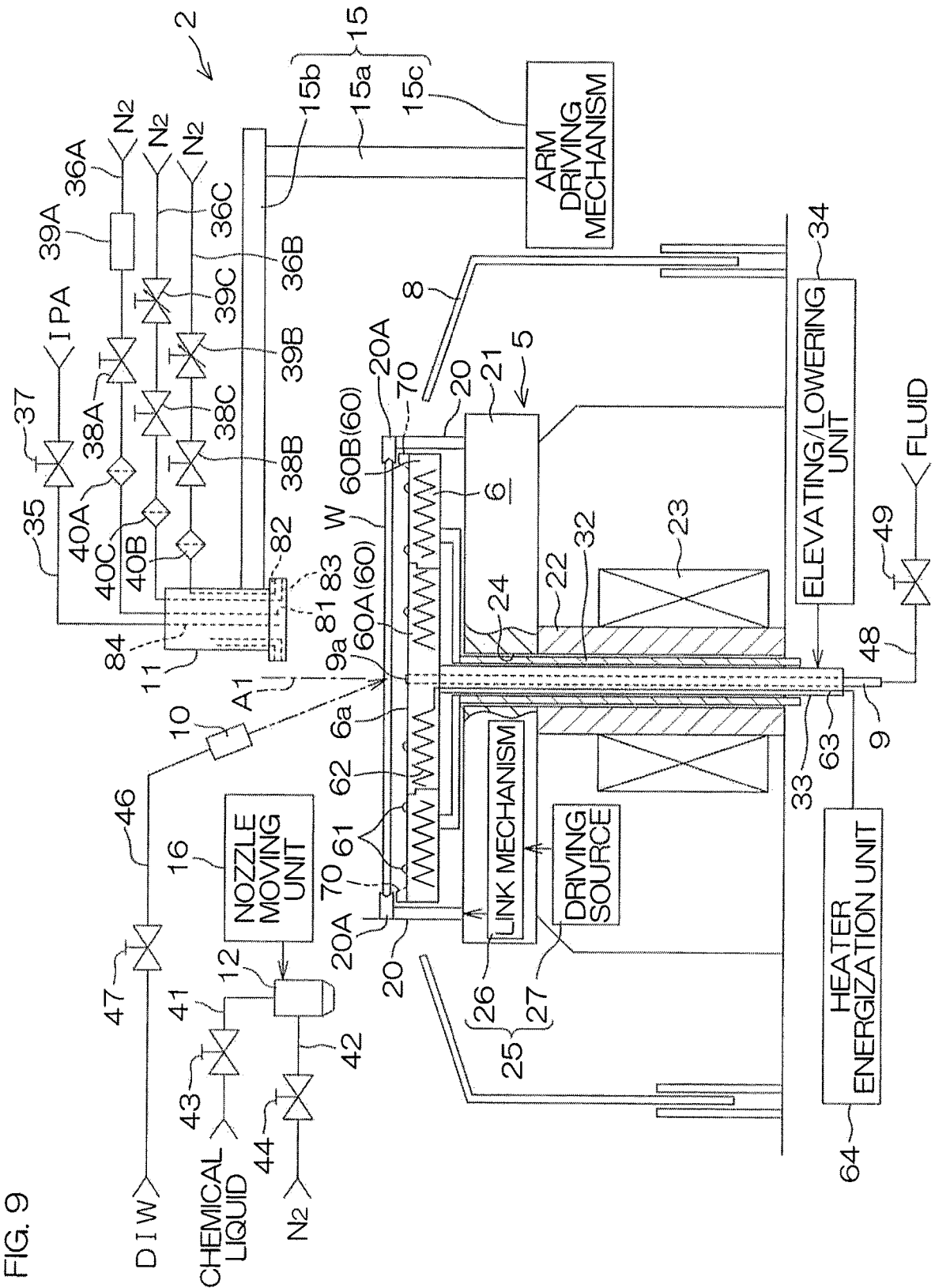
FIG. 9 is an illustrative sectional view for describing the arrangement of a processing unit according to a second preferred embodiment of the present invention.
Figure 10:
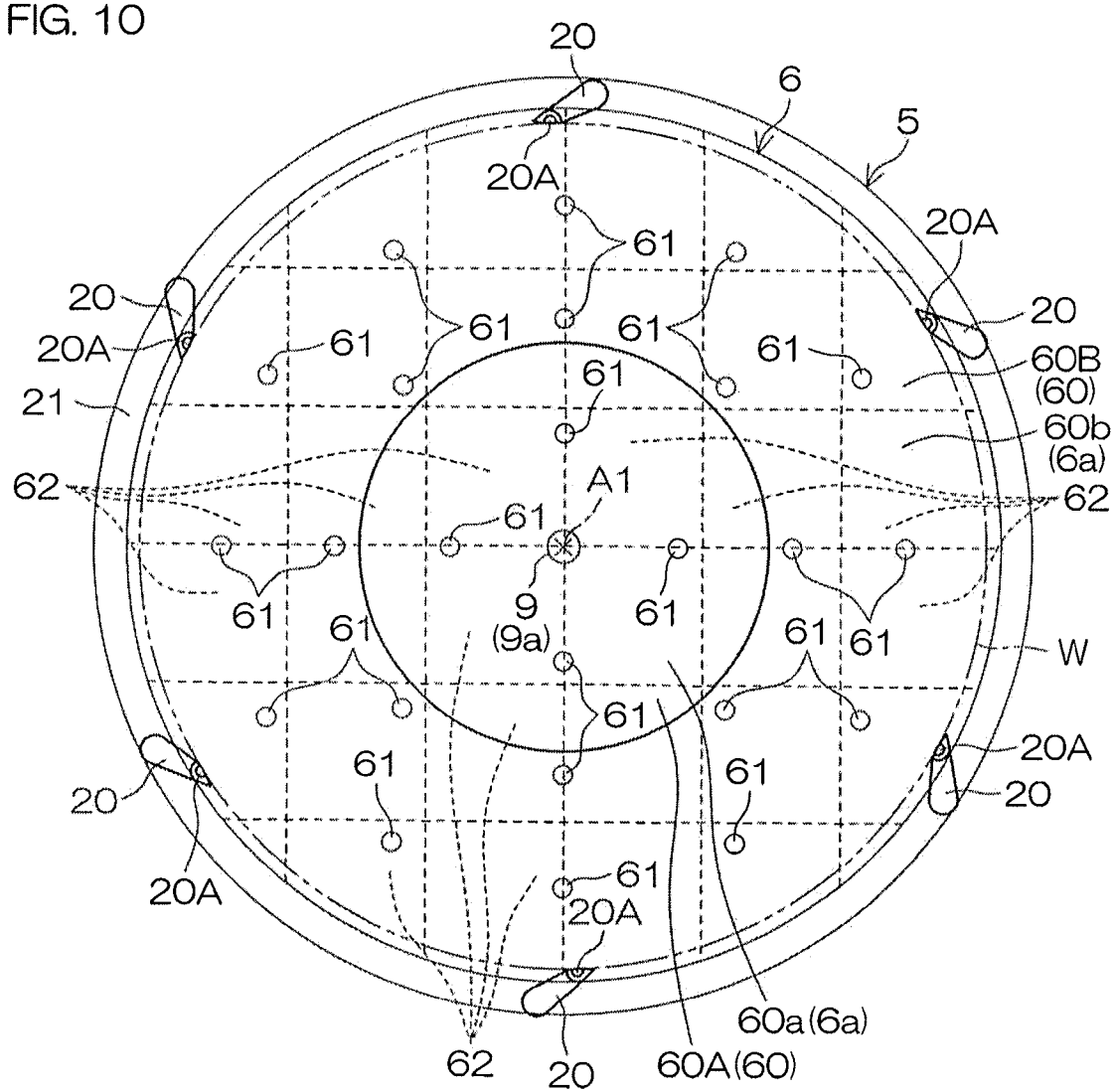
FIG. 10 is a plan view of a spin chuck, etc., included in the processing unit.

FIG. 9 is an illustrative sectional view for describing the arrangement of a processing unit 2 according to a second preferred embodiment of the present invention. Also, FIG. 10 is a plan view of a heater unit, etc. In FIG. 9 and FIG. 10, portions corresponding to those in FIG. 2 and FIG. 3 are indicated by the same reference symbols. In the present preferred embodiment, the lift pins 4 and the lift pin elevating/lowering unit 7 are not provided. On the other hand, the main plate body 60 of the heater unit 6 is divided into a central portion 60A and an outer peripheral portion 60B surrounding it.

The central portion 60A may, for example, have a circular shape in plan view, and has a size smaller than the substrate W and an outer periphery further inward than the clamping portions 20A of the chuck pins 20 in the closed state. The outer peripheral portion 60B has an inner edge shape corresponding to the outer periphery of the central portion and has an outer peripheral shape (of, for example, a circle) larger than the substrate W. A heating surface 60a (upper surface) of the central portion 60A and a heating surface 60b (upper surface) of the outer peripheral portion 60B form the heating surface 6a of the heater unit 6. The heating surface 6a is larger than the substrate W and, in the present preferred embodiment, constitutes a circular shape of a diameter greater than the diameter of the substrate W. The outer periphery (the entire outer periphery in the present preferred embodiment) of the substrate W is thereby made to overlap with the heating surface 6a in top view. Also, the entirety of the substrate W overlaps with the heating surface 6a in top view.

Whereas the outer peripheral portion 60b is supported by a supporting shaft 32, the central portion 60A is supported by an elevating/lowering shaft 33 inserted through an interior of the supporting shaft 30. The supporting shaft 32 is a hollow shaft that is inserted through the rotating shaft 22, has the outer peripheral portion 60B coupled to an upper end thereof, and has its lower end drawn out and fixed lower than the rotating shaft 22. The elevating/lowering shaft 33 is inserted through the supporting shaft 32, has the central portion 60A coupled to an upper end thereof, and has its lower end drawn out lower than the supporting shaft 32 and coupled to an elevating/lowering unit 34. The central portion 60A and the elevating/lowering unit 34 constitute an example of the transferring unit that transfers the substrate W between the spin chuck 5 and the heater unit 6.

The elevating/lowering unit 34 includes, for example, a ball screw mechanism. The elevating/lowering unit 34 moves the elevating/lowering shaft 33 vertically to thereby make the central portion 60A, which is a movable portion that is vertically movable, move vertically between an upper position and a lower position and can make the central portion 60A stop at any position between the upper position and the lower position. By vertical movement of the central portion 60A, the heating surface 60a of the central portion 60A is moved vertically relative to the heating surface 60b of the outer peripheral portion 60B. That is, the heating surface 60a of the central portion 60A is a movable portion provided inside the heating surface 6a of the heater unit 6. The lower position of the central portion 60A is a position at which the heating surface 60a thereof is set at the same height as the heating surface 60b of the outer peripheral portion 60B. The upper position of the central portion 60A is a position at which the heating surface 60a thereof is set at a height higher than a substrate holding height of the spin chuck 5. The central portion 60A supports the lower surface of the substrate W at a position further inward than the positions at which the spin chuck 5 contacts the substrate W and is also an example of an elevating/lowering member that moves vertically and penetratingly through the heating surface 6a.

FIG. 11A to FIG. 11G show conditions inside the chamber 13 of the processing unit 2 in main steps of substrate processing.

Figure 11A:
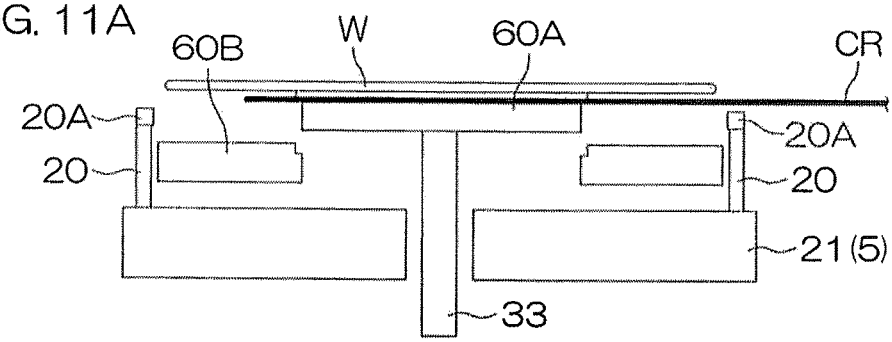
FIG. 11A to FIG. 11G show conditions inside a chamber of the processing unit in main steps of the substrate processing.
Figure 11B:
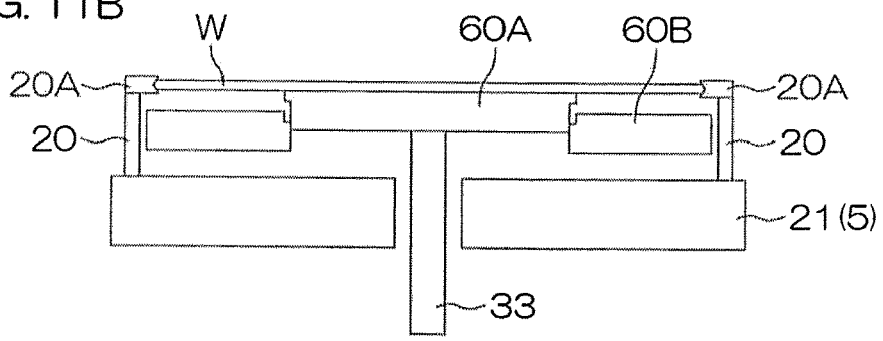

When the transfer robot CR carries in an unprocessed substrate W and when the transfer robot CR carries out a processed substrate W, the controller 3 controls the elevating/lowering unit 34 to position the central portion 60A at the upper position (see FIG. 11A). The transfer robot CR carries the unprocessed substrate W into the processing unit 2 by placing the unprocessed substrate W on the central portion 60A. Also, the transfer robot CR carries the processed substrate W out of the processing unit 2 by scooping up the processed substrate W from the central portion 60A. That is, the upper position is a substrate carry-in/carry-out position.

After the unprocessed substrate W is passed onto the central portion 60A, the controller 3 executes control for passing the substrate W from the central portion 60A to the spin chuck 5. That is, the controller 3 controls the chuck pin driving unit 25 to put the chuck pins 20 in the open state. On the other hand, the controller 3 controls the elevating/lowering unit 34 to position the central portion 60A at a receiving/passing height at which the substrate W is set at a height of being held by the chuck pins 20. In that state, the controller 3 controls the chuck pin driving unit 25 to put the chuck pins 20 in the closed state. The substrate W is thereby passed from the central portion 60A onto the spin chuck 5 (see FIG. 11B).

Figure 11C:
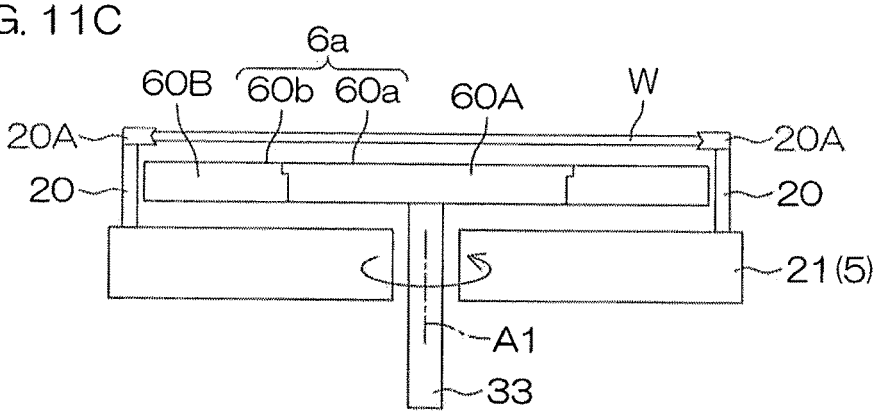
Figure 11D:
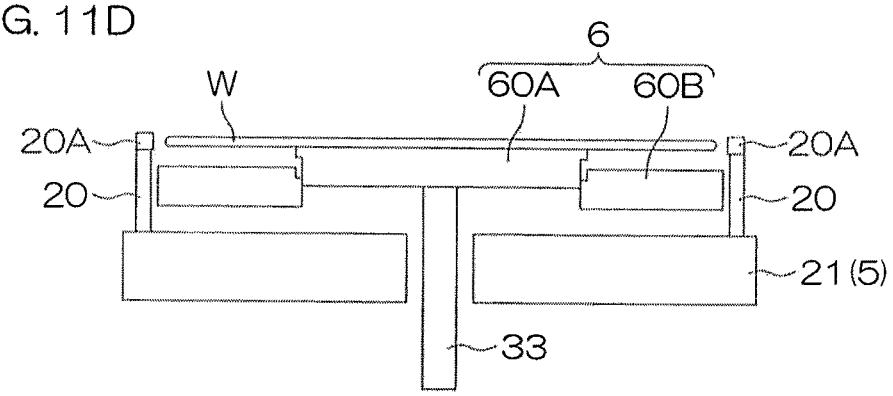

Thereafter, the controller 3 controls the elevating/lowering unit 34 to lower the central portion 60A to the lower position (see FIG. 11C). In this state, the chemical liquid processing, the rinse processing, and the organic solvent liquid film forming processing are executed in the same manner as in the first preferred embodiment.

After the above processing steps, the controller 3 controls the electric motor 23 to stop the rotation of the spin chuck 5. Further, the controller 3 controls the elevating/lowering unit 34 to elevate the central portion 60A to the receiving/passing height. In that state, the controller 3 controls the chuck pin driving unit 25 to put the chuck pins 20 in the open state. The substrate W is thereby passed from the spin chuck 5 onto the central portion 60A (see FIG. 11D; portion of transferring step).

Figure 11E:
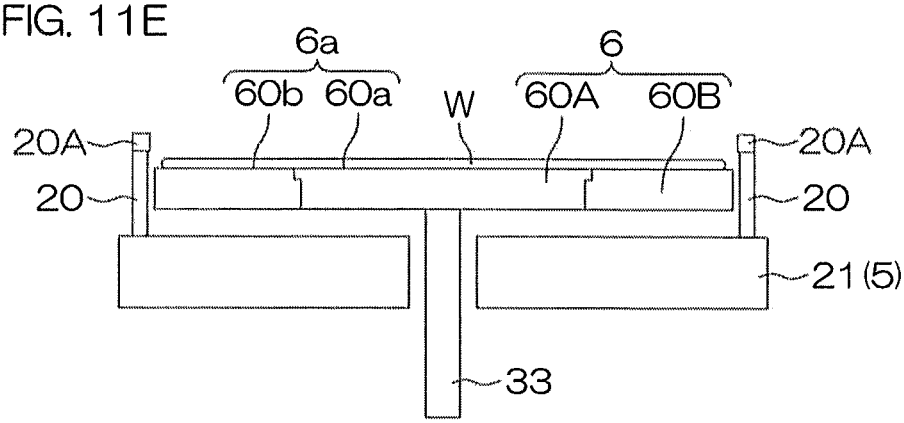
Figure 11F:
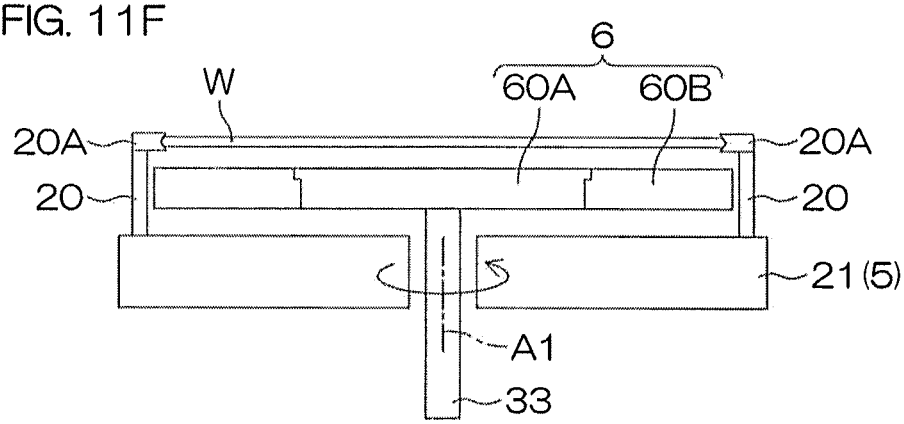
Figure 11G:
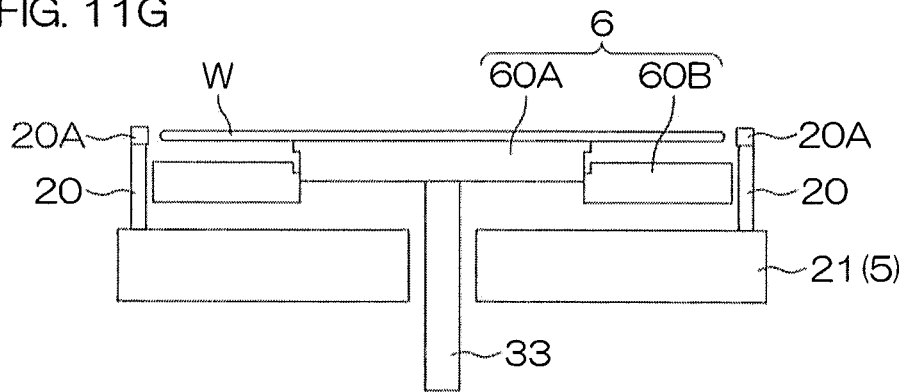

Thereafter, the controller 3 controls the elevating/lowering unit 34 to lower the central portion 60A to the lower position (see FIG. 11E; portion of transferring step). The entirety of the lower surface of the substrate W is thereby put in contact with the heating surface 6a and put in a state of being heated by thermal conduction from the heating surface 6a. In this state, the processing steps for substrate heating, opening of a hole in the liquid film, and removal of the liquid film are executed in the same manner as in the first preferred embodiment.

After the above processing steps, the controller 3 controls the elevating/lowering unit 34 to elevate the central portion 60A to the receiving/passing height. In that state, the controller 3 controls the chuck pin driving unit 25 to put the chuck pins 20 in the closed state. The substrate W is thereby passed from the central portion 60A onto the spin chuck 5 (same state as in FIG. 11B). Thereafter, the controller 3 controls the elevating/lowering unit 34 to lower the central portion 60A, for example, to the lower position so as to separate it from the lower surface of the substrate W. In that state, the controller 3 drives the electric motor 23 to rotate the spin chuck 5 and execute the spin base drying processing (see FIG. 11F).

After then stopping the rotation of the spin chuck 5, the controller 3 controls the elevating/lowering unit 34 to elevate the central portion 60A to the receiving/passing height. In that state, the controller 3 controls the chuck pin driving unit 25 to put the chuck pins 20 in the open state. The substrate W is thereby passed from the spin chuck 5 onto the central portion 60A (see FIG. 11G). Thereafter, the controller 3 controls the elevating/lowering unit 34 to elevate the central portion 60A to the upper position (carry-in/carry-out height) (see FIG. 11A). Thereafter, the transfer robot CR scoops up the substrate W from the central portion 60A and carries it out of the processing unit 2.

As described above, with the second preferred embodiment, the central portion 60A of the main plate body 60 of the heater unit 6 moves vertically while supporting the lower surface of the substrate W at the position further inward than the chuck pins 20. That is, a movable portion capable of moving vertically is provided in an inner region of the heating surface 6a of the heater unit 6. The substrate W can be transferred between the spin chuck 5 and the heater unit 6 by the vertical movement of the central portion 60A. The substrate W can thus be transferred between the spin chuck 5 and the heater unit 6 without inverting a vertical relationship of the spin chuck 5 and a fixed portion (heating portion 60b of the outer peripheral portion 60B) of the heating surface 6a. The heater unit 6 having the larger heating surface 6a than the substrate W can thereby be designed without having to consider interference with the chuck pins 20 in the process of transferring the substrate W.

Figure 12:
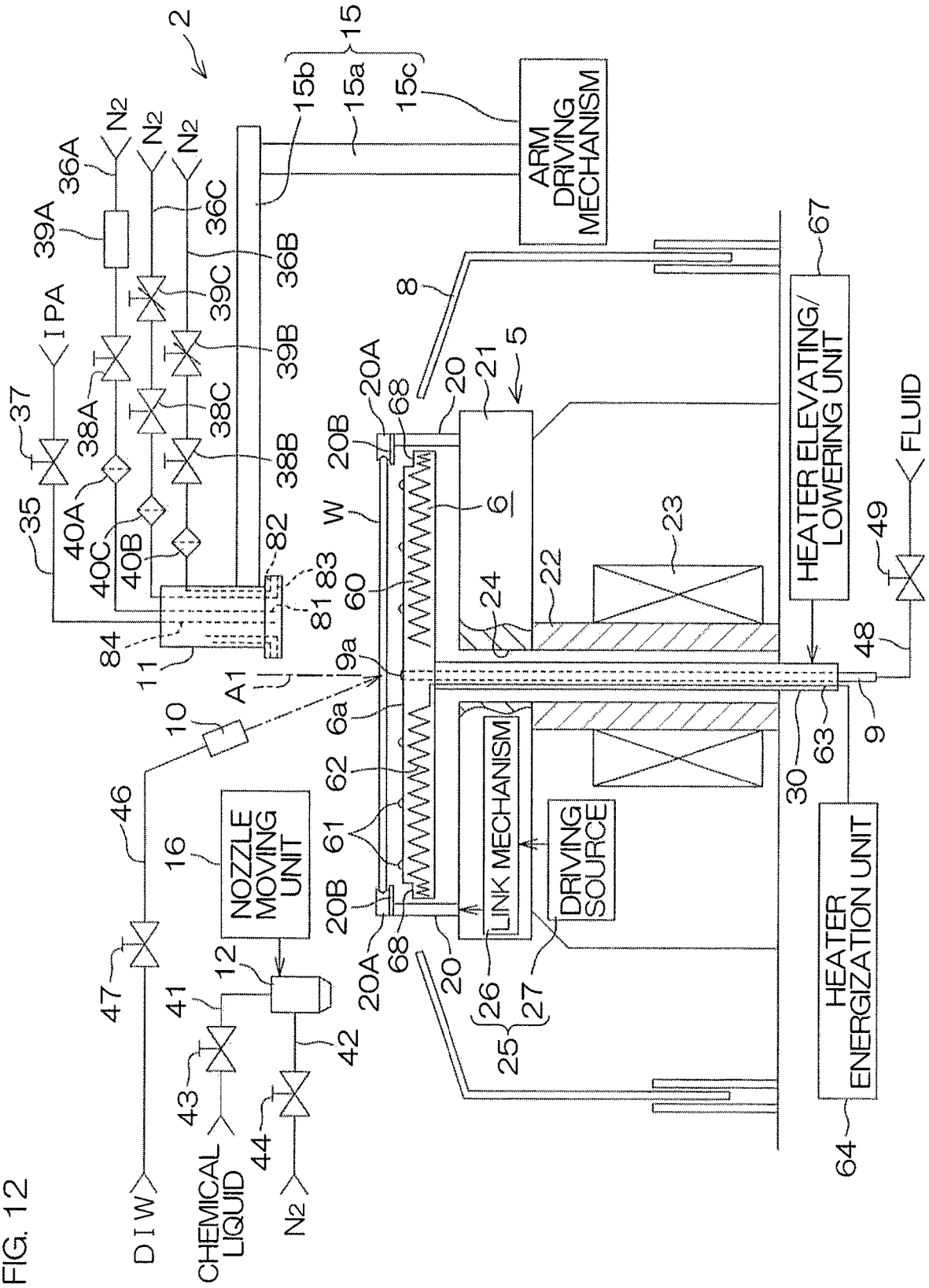
FIG. 12 is an illustrative sectional view for describing the arrangement of a processing unit according to a third preferred embodiment of the present invention.
Figure 13:
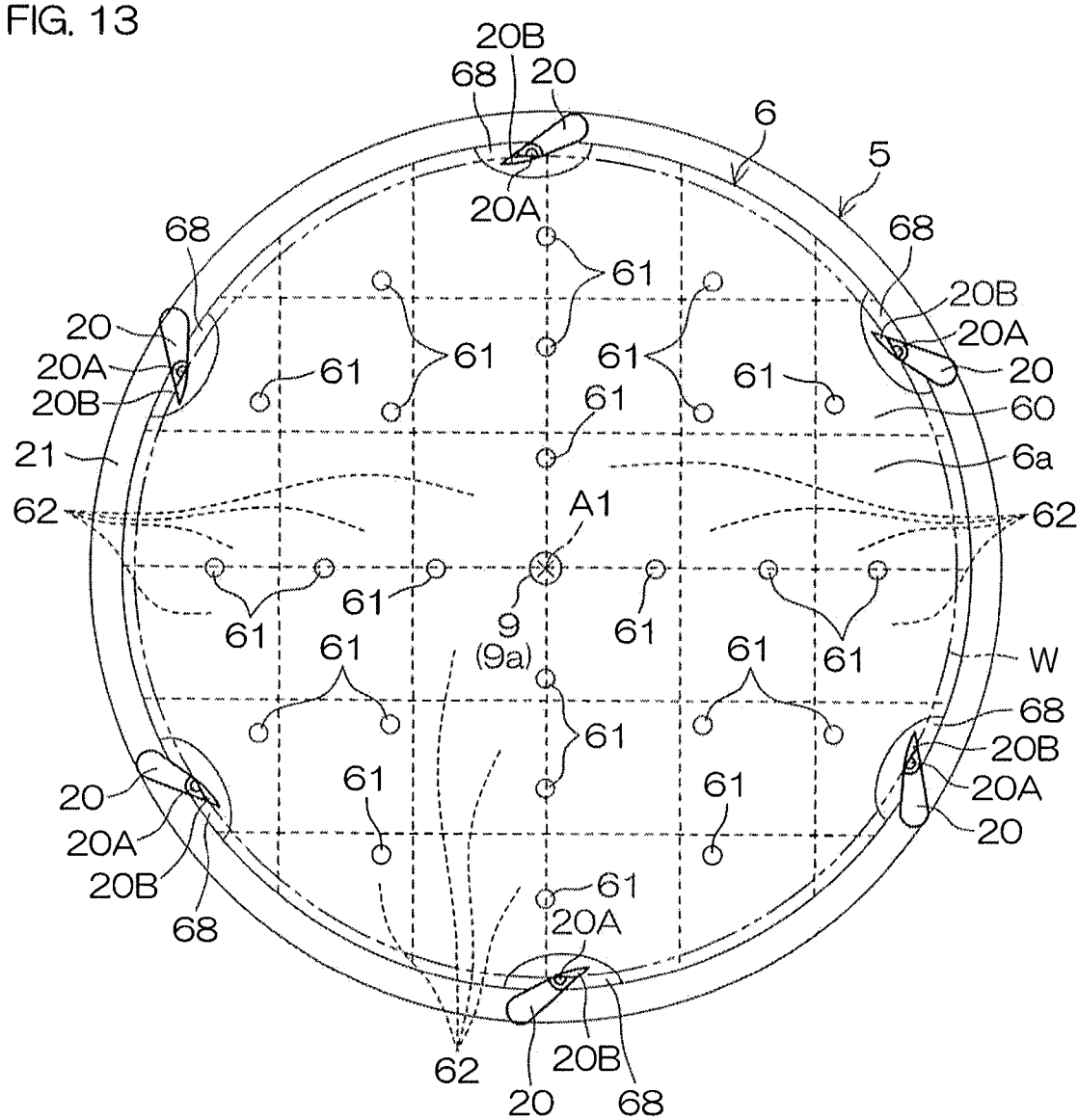
FIG. 13 is a plan view of a spin chuck, etc., included in the processing unit.

FIG. 12 is an illustrative sectional view for describing the arrangement of a processing unit 2 according to a third preferred embodiment of the present invention. Also, FIG. 13 is a plan view of a heater unit, etc. In FIGS. 12 and FIG. 13, portions corresponding to those in FIG. 2 and FIG. 3 are indicated by the same reference symbols. In the present preferred embodiment, the lift pins 4 and the lift pin elevating/lowering unit 7 are not provided.

On the other hand, a heater elevating/lowering unit 67 arranged to elevate and lower the heater unit 6 having the heating surface 6a larger than the substrate W is included. The heater elevating/lowering unit 67 is coupled to the lower end of the supporting shaft 30 of the heater unit 6 and moves the heater unit 6 vertically by moving the supporting shaft vertically. More specifically, the heater elevating/lowering unit 67 moves the heater unit 6 vertically between a heating processing position (upper position), at which the heating surface 6a supports the substrate W at a position higher than the position of substrate holding by the spin chuck 5, and a retracted position (lower position), at which the heating surface 6a is separated downward from the lower surface of the substrate W held by the spin chuck 5. The heater elevating/lowering unit 67 includes, for example, a ball screw mechanism and is arranged to be capable of holding the heater unit 6 at any height between the upper position and the lower position. The heater elevating/lowering unit 67 is an example of the transferring unit that transfers the substrate W between the spin chuck 5 and the heater unit 6.

Figure 13A:
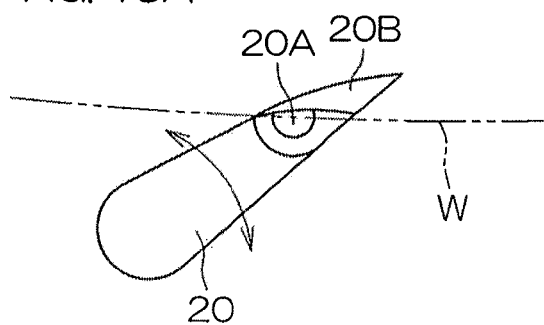
FIG. 13A and FIG. 13B are enlarged plan views of a chuck pin.
Figure 13B:
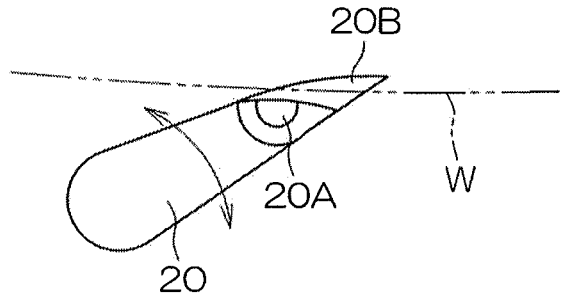

As shown in enlarged manner in FIG. 13A and FIG. 13B, in the present preferred embodiment, each of the chuck pins 20 of the spin chuck 5 includes not only the clamping portion 20A but also a supporting portion 20B. As shown in FIG. 13A, when the chuck pins 20 are in the closed state, each clamping portion 20A contacts the peripheral end surface of the substrate W to clamp the substrate W. In this state, the lower surface of the substrate W is separated upward from the supporting portions 20B and the peripheral edge portion of the substrate W overlaps with the supporting portions 20B in top view. As shown in FIG. 13B, when the chuck pins 20 are in the open state, each clamping portion 20A is retracted from the peripheral end surface of the substrate W and, on the other hand, a lower surface of the peripheral edge portion of the substrate W is put in contact with and supported by the supporting portions 20B. The peripheral edge portion of the substrate W overlaps with the supporting portions 20B in top view in this state as well. The spin chuck 5 is thus arranged to be capable of supporting the substrate W not only when the chuck pins 20 are in the closed state but also when the chuck pins 20 are in the open state.

On the other hand, recesses 68 are formed in the heating surface 6a of the heater unit 6 at plural locations corresponding to the positioning of the chuck pins 20. Each recess 68 is formed to a size and shape enabling housing of a supporting portion 20B in top view. To be more accurate, each recess 68 has a planar shape and size enabling housing of a portion overlapping with the substrate W (mainly a portion of a supporting portion 20B) in top view when the chuck pins 20 are in the open state (see FIG. 13B). In the present preferred embodiment, the recess 68 is a counter-bored portion and has a bottom surface facing the corresponding supporting portion 20B. The heater 62 is disposed at an entirety of the heater unit 6 and is also disposed at positions corresponding to the bottom surfaces of the recesses 68.

If, when the chuck pins 20 are in the open state, the heater unit 6 is elevated to the heating processing position (upper position) with the chuck pins 20 and the recesses 68 being matched in plan view, the substrate W placed on the supporting portions 20B is passed onto the heating surface 6a of the heater unit 6 and further, the supporting portions 20B enter into the recesses 68. In this state, at portions other than regions overlapping with the recesses 68 in plan view, the heating surface 6a contacts the lower surface of the substrate W and heats the substrate W by thermal conduction, and at regions overlapping with the recesses 68 in plan view, the substrate W is heated by radiant heat from the bottom surfaces of the recesses 68. The entirety of the lower surface of the substrate W is thus heated substantially uniformly in the state of facing the heater unit 6.

Figure 14A:
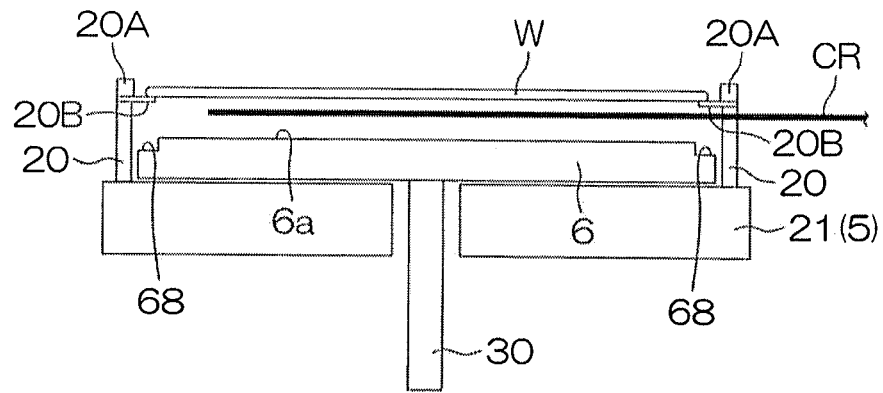
FIG. 14A to FIG. 14C show conditions inside a chamber of the processing unit in main steps of the substrate processing.
Figure 14B:
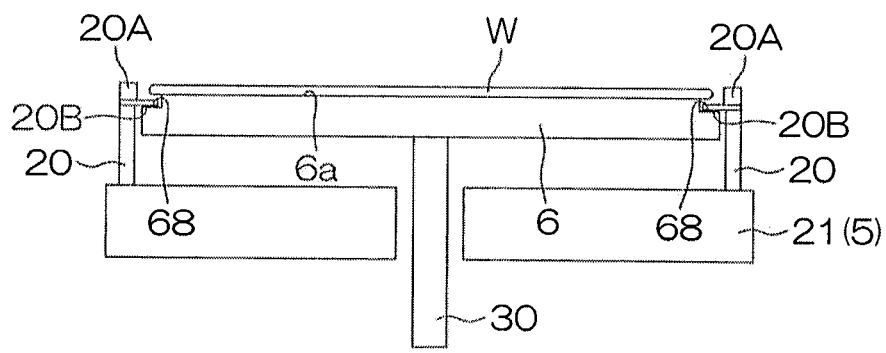
Figure 14C:
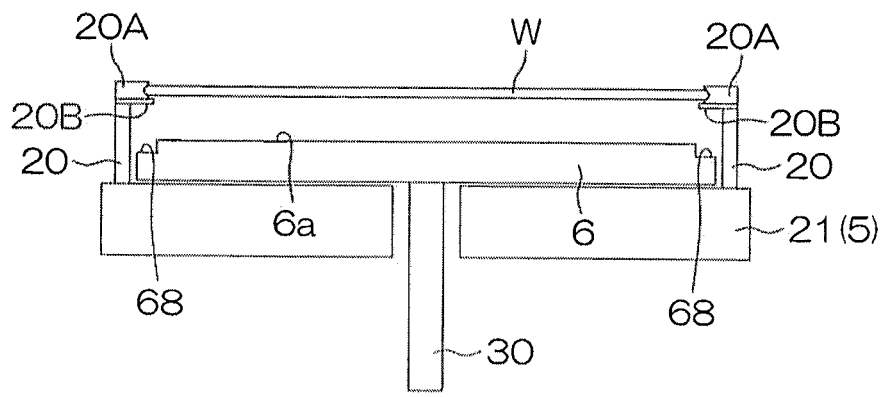

FIG. 14A to FIG. 14C show conditions inside the chamber of the processing unit 2 in main steps of substrate processing.

When the transfer robot CR carries in an unprocessed substrate W and when the transfer robot CR carries out a processed substrate W, the controller 3 controls the heater elevating/lowering unit 67 to position the heater unit 6 at the lower position and controls the chuck pin driving unit 25 to put the chuck pins 20 in the open state (see FIG. 14A). The transfer robot CR carries the unprocessed substrate W into the processing unit 2 by placing the unprocessed substrate W on the supporting portions 20B of the chuck pins 20. Also, the transfer robot CR carries the processed substrate W out of the processing unit 2 by scooping up the processed substrate W from the supporting portions 20B of the chuck pins 20.

After the unprocessed substrate is passed onto the spin chuck 5, the controller 3 controls the chuck pin driving unit 25 to put the chuck pins 20 in the closed state. In this state, the chemical liquid processing, the rinse processing, and the organic solvent liquid film forming processing are executed in the same manner as in the first preferred embodiment.

After the above processing steps, the controller 3 controls the electric motor 23 to stop the rotation of the spin chuck 5. In this process, the controller 3 stops the rotation of the spin chuck 5 while controlling its rotation position to make the chuck pins 20 and the recesses 68 of the heater unit 6 be matched. Also, the controller 3 controls the chuck pin driving unit 25 to put the chuck pins 20 in the open state. The substrate W is thereby put in the state of being placed on the supporting portions 20B of the chuck pins 20. In that state, the controller 3 controls the heater elevating/lowering unit 67 to elevate the heater unit 6 to the heating processing position. In this process, the substrate W is passed from the supporting portions 20B of the chuck pins 20 onto the heating surface 6a of the heater unit 6 (see FIG. 14B; portion of transferring step). Substantially the entirety of the lower surface of the substrate W is thereby put in contact with the heating surface 6a and put in the state of being heated by thermal conduction from the heating surface 6a (substrate heating step). Also, the supporting portions 20B enter into the recesses 68 and in interiors of the recesses 68, the substrate W is heated by radiant heat from bottom portions of the recesses 68. In this state, the processing steps for substrate heating, opening of a hole in the liquid film, and removal of the liquid film are executed in the same manner as in the first preferred embodiment. In this state, the clamping portions 20A of the chuck pins 20 face the peripheral end surface of the substrate W and therefore the clamping portions 20A can act as substrate guides that restrict displacement of the substrate W in the horizontal direction.

After the above processing steps, the controller 3 controls the heater elevating/lowering unit 67 to lower the heater unit 6 to the lower position. In this process, the substrate W is passed onto the supporting portions 20B of the spin chuck 5. Thereafter, the controller 3 controls the chuck pin driving unit 25 to put the chuck pins 20 in the closed state. In that state, the controller 3 drives the electric motor 23 to rotate the spin chuck 5 and execute the spin base drying processing (see FIG. 14C).

After then stopping the rotation of the spin chuck 5, the controller 3 controls the chuck pin driving unit 25 to put the chuck pins 20 in the open state (see FIG. 14A). The substrate W is thereby put in the state of being placed on the supporting portions 20B of the chuck pins 20. Thereafter, the transfer robot CR scoops up the substrate W from the spin chuck 5 and carries it out of the processing unit 2.

As described above, with the third preferred embodiment, the substrate W is transferred between the spin chuck 5 and the heater unit 6 by the vertical movement of the heater unit 6. The recesses 68, by which interference with the supporting portions 20B of the chuck pins 20 is avoided when the heating surface 6a is elevated, are formed in the heating surface 6a of the heater unit 6. The heater unit 6 can thereby receive and pass the substrate W from and to the chuck pins 20 without interference with the chuck pins 20 even while having the heating surface 6a of a diameter greater than the substrate W.

Figure 15:
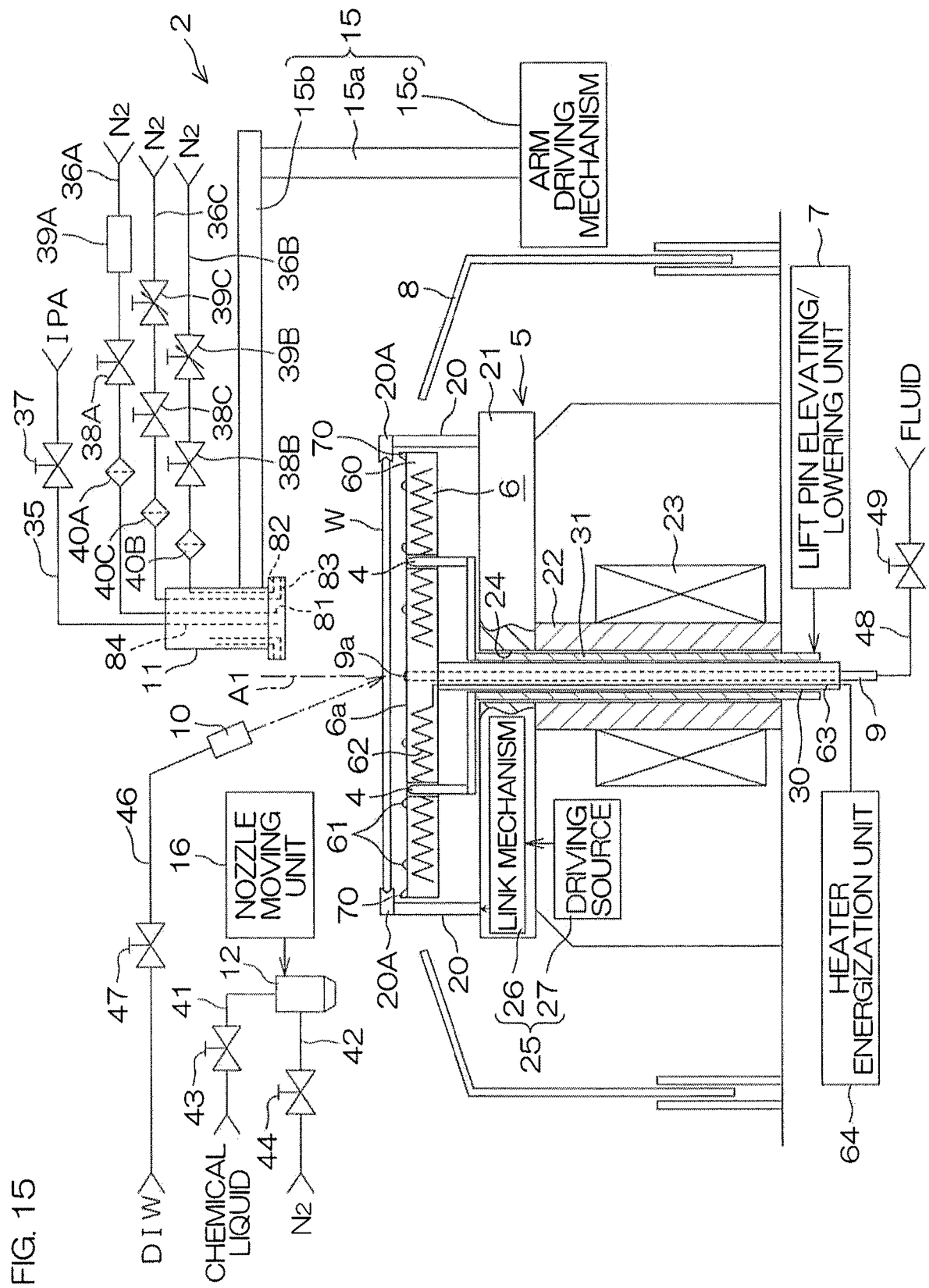
FIG. 15 is an illustrative sectional view for describing the arrangement of a processing unit according to a fourth preferred embodiment of the present invention.
Figure 16:
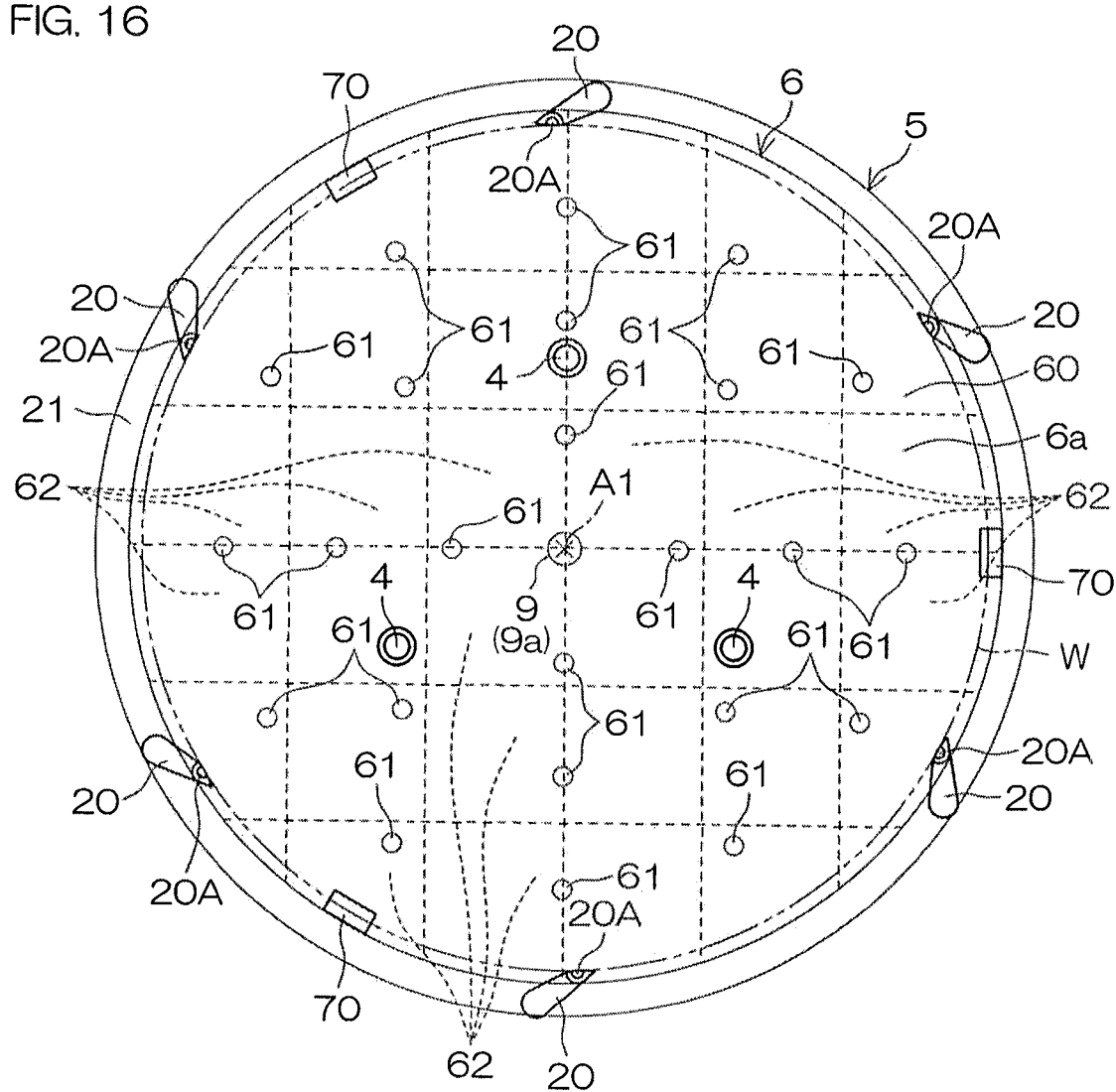
FIG. 16 is a plan view of a heater unit, etc., included in the processing unit.

FIG. 15 is an illustrative sectional view for describing the arrangement of a processing unit 2 according to a fourth preferred embodiment of the present invention. Also, FIG. 16 is a plan view of the heater unit, etc. In FIG. 15 and FIG. 16, portions corresponding to those in FIG. 2 and FIG. 3 are indicated by the same reference symbols.

In the present preferred embodiment, substrate guides 70, arranged to position the substrate W on the heating surface 6a of the heater unit 6, are disposed. Each substrate guide 70 is a drop-in guide that is disposed at a position corresponding to the peripheral end surface of the substrate W, has an inclined surface inclining downward from an outer side to an inner side, and aligns the substrate W by letting it drop toward the inner side of the inclined surface. In the present preferred embodiment, a plurality (three, in the example of FIG. 16) of the substrate guides 70 are provided at intervals along a circumferential direction of the substrate W. Although it suffices that one or more of the substrate guide 70 be provided, it is preferable for a plurality to be provided. The substrate guide 70 may be an annular guide spanning an entire periphery of the peripheral end surface of the substrate W or may be an arcuate guide that is continuous an arcuate shape along a portion of the peripheral end surface of the substrate W.

By providing the substrate guides 70 at the heating surface 6a of the heater unit 6, the substrate W is aligned when the substrate W is placed on the heating surface 6a. The position of the substrate W can thereby be controlled to a position enabling the substrate W to be passed reliably from the lift pins 4 to the spin chuck 5 when the substrate W is pushed up by the lift pins 4 after the heating processing.

For the same reason, it is also preferable for the substrate guides 70 to be disposed at the heating surface 6a in the second preferred embodiment as indicated by alternate long and two short dashes lines in FIG. 9. The substrate guides 70 may also be provided at the heating surface 6a in third preferred embodiment as well.

Although preferred embodiments of the present invention have been described above, the present invention may be implemented in yet other modes.

For example, with each of the preferred embodiments described above, the liquid film 150 of the organic solvent is formed on the substrate W and then has the hole 151 opened in the center thereof, and the organic solvent is removed off the substrate W by spreading the hole 151. However, the opening of the hole 151 is not necessarily required. For example, after forming a thin liquid film of the organic solvent on the substrate W, the lower surface of the substrate W may be put in contact with the heating surface 6a of the heater unit 6 to make the organic solvent evaporate instantaneously throughout the entirety of the substrate W.

Also, as examples of an organic solvent other than IPA that may be used, methanol, ethanol, acetone, and HEF (hydrofluoroether) can be cited. All of these are organic solvents that are lower in surface tension than water (DIW).

Also with each of the preferred embodiments described above, an example was illustrated where DIW, as the organic solvent rinse liquid, is replaced by the organic solvent and the inert gas is used to remove the organic solvent off the substrate. However, the present invention is also applicable to a process that does not have the organic solvent processing (step S4 of FIG. 8). More specifically, the present invention may be applied to a substrate processing method including a chemical liquid processing step of processing a substrate with a chemical liquid, a rinse processing step of thereafter replacing the chemical liquid on the substrate by a rinse liquid (DIW, etc.), and a rinse liquid removing step of thereafter removing the rinse liquid, on the substrate, off the substrate. That is, the heater unit may be put in contact with the substrate in the rinse liquid removing step.

Also, although with each of the preferred embodiments described above, a case where the substrate has a circular shape and the heating surface of the heater unit has a circular shape of larger diameter than the diameter of the substrate was described, the heating surface of the heater unit is not required to be circular even if the substrate is circular, and may, for example, have a polygonal shape. Also, the substrate to be processed is not required to be circular and the present invention may be applied for processing, for example, a rectangular substrate.

Also, although with the second preferred embodiment illustrated above, the arrangement where the central portion 60A of the main plate body 60 of the heater unit 6 has the circular heating surface 60a was described, the heating surface 60a is not required to be circular and may have a rectangular shape or other polygonal shape. Also, it suffices that a portion of the heating surface 60a be a movable portion that is elevated and lowered, and the movable portion is not restricted in shape, position, and number to that illustrated with the second preferred embodiment. For example, a plurality of movable portions may be provided at the heating surface. An arrangement is also possible where an annular movable portion, disposed further inward than the chuck pins 20, is moved vertically.

Also, although with the third preferred embodiment illustrated above, an example where the recesses 68 have bottom surfaces was described, the recesses 68 may instead be penetrating holes penetrating through the heater unit 6.

While preferred embodiments of the present invention have been described in detail above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
   a substrate holder which holds a substrate in a horizontal orientation by clamping a peripheral edge portion of the substrate, the substrate holder having a plurality of clamps that are configured to hold the substrate in the horizontal orientation by clamping the peripheral edge potion of the substrate;
   a clamp driver which drives the clamps between a closed state in which the clamps are in contact with a peripheral edge of the substrate to clamp the substrate, and an open state in which the clamps are separated away from the peripheral edge of the substrate;
   a substrate rotator which rotates the substrate held by the substrate holder;
   a substrate heater which has a heating surface which faces the substrate, held by the substrate holder, from below and overlaps with an outermost periphery of the substrate in top view, and heats the substrate in a state of contacting a lower surface of the substrate;
   a carrier which transfers the substrate between the substrate holder and the substrate heater when the clamp driver drives the clamps such that the clamps are in the open state; and a processing fluid supply which supplies a processing fluid toward the substrate held by the substrate holder, wherein the substrate heater includes a plate body having a flat top surface, the heating surface includes the top surface of the plate body, the top surface of the plate body opposes from below to the substrate held by the substrate holder, and overlaps with the outermost periphery of the substrate in top view, and the top surface of the plate body opposes to a central portion as well as an outermost periphery of the lower surface of the substrate with a fixed space, or contacts the central portion as well as the outermost periphery of the lower surface of the substrate.

2. The substrate processing apparatus according to claim 1, wherein the heating surface overlaps with an entirety of the substrate, held by the substrate holder, in top view.

3. The substrate processing apparatus according to claim 1, wherein the substrate holder is configured to be retractable outward from between the substrate and the heating surface.

4. The substrate processing apparatus according to claim 1, wherein the carrier includes an elevator support which supports the lower surface of the substrate at a position further inward than a position at which the substrate holder contacts the substrate and moves vertically up and down and penetratingly through the heating surface, and an elevator which moves the elevator support vertically up and down.

5. The substrate processing apparatus according to claim 1, wherein the heating surface includes a movable portion which moves vertically while supporting the lower surface of the substrate at a position further inward than a position at which the substrate holder contacts the substrate, and the carrier includes an elevator which moves the movable portion vertically up and down.

* * * * *